United States Patent
Shimoda et al.

(10) Patent No.: US 10,475,580 B2
(45) Date of Patent: Nov. 12, 2019

(54) OXIDE DIELECTRIC AND METHOD FOR MANUFACTURING SAME, AND SOLID STATE ELECTRONIC DEVICE AND METHOD FOR MANUFACTURING SAME

(71) Applicants: Japan Advanced Institute of Science and Technology, Ishikawa (JP); ADAMANT CO., LTD., Tokyo (JP)

(72) Inventors: Tatsuya Shimoda, Ishikawa (JP); Satoshi Inoue, Ishikawa (JP); Tomoki Ariga, Ishikawa (JP)

(73) Assignees: JAPAN ADVANCED INSTITUTE OF SCIENCE AND TECHNOLOGY, Tokyo (JP); ADAMANT NAMIKI PRECISION JEWEL CO., LTD., Tokyo (JP)

( * ) Notice: Subject to any disclaimer, the term of this patent is extended or adjusted under 35 U.S.C. 154(b) by 295 days.

(21) Appl. No.: 15/327,571

(22) PCT Filed: Jul. 10, 2015

(86) PCT No.: PCT/JP2015/069852
§ 371 (c)(1),
(2) Date: Jan. 19, 2017

(87) PCT Pub. No.: WO2016/013416
PCT Pub. Date: Jan. 28, 2016

(65) Prior Publication Data
US 2017/0162324 A1 Jun. 8, 2017

(30) Foreign Application Priority Data
Jul. 25, 2014 (JP) ................................ 2014-151942

(51) Int. Cl.
*H01G 4/12* (2006.01)
*C04B 35/45* (2006.01)
(Continued)

(52) U.S. Cl.
CPC ....... *H01G 4/1254* (2013.01); *C04B 35/4521* (2013.01); *C04B 35/495* (2013.01);
(Continued)

(58) Field of Classification Search
CPC .......... H01G 4/1254; C04B 2235/3298; C04B 2235/3251; H01L 29/7869
See application file for complete search history.

(56) References Cited

U.S. PATENT DOCUMENTS

| 7,132,381 B1 | 11/2006 | Oh et al. |
| 2006/0140031 A1 | 6/2006 | Kijima et al. |

(Continued)

FOREIGN PATENT DOCUMENTS

| CN | 1792999 A | 6/2006 |
| EP | 1675163 A2 | 6/2006 |

(Continued)

OTHER PUBLICATIONS

Investigation of solution-processed bismuth-niobium-oxide filmsSatoshi Inoue, Tomaki Ariga, Shin Matsumoto, Masatoshi Onoue, Takaaki Miyasako, Eisuke Tokumitsu,Norimichi Chinone, Yasuo Cho, Tatsuya ShimodaJournal of Applied Physics 116, 154103 (2014); https://doi.org/10.1063/1.4898323 (Year: 2014).*

(Continued)

*Primary Examiner* — Hoang-Quan T Ho
*Assistant Examiner* — Khatib A Rahman

(57) ABSTRACT

There are provided an oxide dielectric having excellent properties and a solid state electronic device (e.g., a capacitor, a semiconductor device, or a small electromechanical system) having such an oxide dielectric.

An oxide layer 30 includes an oxide dielectric (possibly including inevitable impurities) including bismuth (Bi) and niobium (Nb) and having a first crystal phase of a pyrochlore-type crystal structure and a second crystal phase of a $\beta$-BiNbO$_4$-type crystal structure. The oxide layer 30 has a controlled content of the first crystal phase and a controlled content of the second crystal phase, in which the first crystal phase has a dielectric constant that decreases with increasing temperature of the oxide layer 30 in a temperature range of 25° C. or more and 120° C. or less, and the second crystal phase has a dielectric constant that increases with increasing temperature of the oxide layer 30 in the temperature range.

18 Claims, 17 Drawing Sheets

(51) Int. Cl.
 *C04B 35/495* (2006.01)
 *H01L 21/02* (2006.01)
 *H01L 29/786* (2006.01)

(52) U.S. Cl.
 CPC .... *H01L 21/0226* (2013.01); *H01L 21/02175* (2013.01); *H01L 29/7869* (2013.01); *C04B 2235/3251* (2013.01)

(56) References Cited

U.S. PATENT DOCUMENTS

| | | | |
|---|---|---|---|
| 2013/0022839 A1 | 1/2013 | Kijima et al. | |
| 2014/0319660 A1* | 10/2014 | Shimoda | H01L 28/40 257/632 |

FOREIGN PATENT DOCUMENTS

| | | | | |
|---|---|---|---|---|
| JP | 2007-051050 A | | 3/2007 | |
| JP | WO2013069470 | * | 1/2013 | ............. H01L 27/04 |
| TW | 201340151 A | | 10/2013 | |
| WO | WO 2011/089748 A1 | | 7/2011 | |
| WO | WO 2013/069470 A1 | | 5/2013 | |
| WO | WO 2013/069471 A1 | | 5/2013 | |

OTHER PUBLICATIONS

High-relative-dielectric-constant bismuth—niobium—oxide films prepared using Nb-rich precursor solutionTomoki Ariga, Satoshi Inoue , Shin Matsumoto, Masatoshi Onoue, Takaaki Miyasako, Eisuke Tokumitsu and Tatsuya Shimoda Japanese Journal of Applied Physics, vol. 54, No. 9 (Year: 2015).*

The State Intellectual Property Office of the Peoples Republic of China, Second Office Action for CN201580032577.3, dated Jun. 28, 2018.
The State Intellectual Property Office of the Peoples Republic of China, Notification of Written Opinion on the Third Examination for CN201580032577.3, Jun. 28, 2018.
State Intellectual Property Office of the People's Republic of China, Office Action for Chinese patent application No. 201580032577.3, dated Jan. 23, 2018.
"Study on Novel Bithmuth-Based Low-Tenperature Sintered Microwave Dielectric Ceramics", Chinese Doctoral Dissertation Full Text Database, Period 01, B015-12, p. 76, Jan. 15, 2012.
Zhou et al., Ceramic structure of (Bi1.5Zn0.5)(Zn0.5Nb1.5)O7 of Bi4Ti3O12 dopant and influences thereof on dielectric properties, Period 08, vol. 36, p. 1204-1206, Dec. 31, 2005.
International Search Report and Written Opinion from International Application No. PCT/JP2015/069852 dated Aug. 25, 2015.
Kim, Eung Soo and Choi, Woong; "Effect of Phase Transition on the Microwave Dielectric Properties of BiNbO$_4$"; Journal of European Ceramic Society 26 (2006) 1761-1766.
European Patent Office, Extended European Search Report for EP patent application No. 15823922.8, dated Mar. 1, 2018.
European Patent Office, European Search Opinion for EP patent application No. 15823922.8, dated Mar. 7, 2018.
Inoue et al., "Investigation of solution-processed bismuth-niobium-oxide films", Journal of Applied Physics, Oct. 21, 2014, vol. 116, No. 15, American Institute of Physics, US.
Taiwan Intellectual Property Office, Taiwan Office Action for Taiwanese Patent Application No. 104123024, dated Feb. 13, 2019.
The State Intellectual Property Office of the Peoples Republic of China, Notification of Written Opinion on the Fourth Examination for CN201580032577.3, dated Apr. 30, 2019.
European Patent Office, Office Action for European Patent Application No. 15 823 922.8, dated Jul. 26, 2019.

* cited by examiner

[Fig. 1]
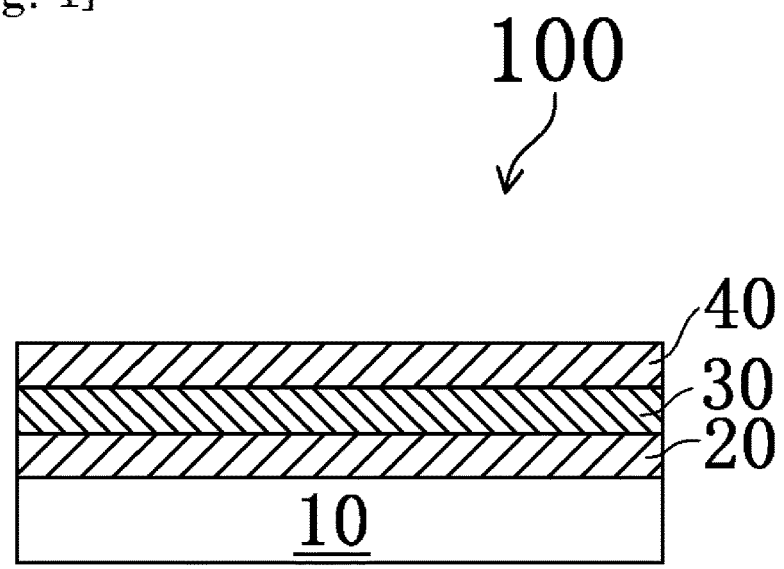
[Fig. 2]
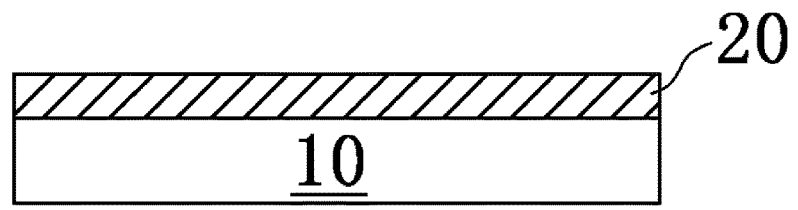

[Fig. 3]
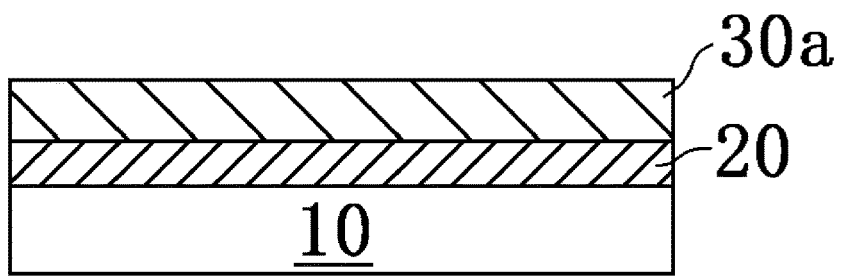
[Fig. 4]
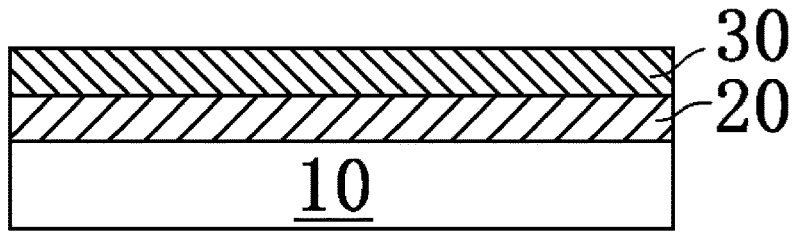

[Fig. 5]
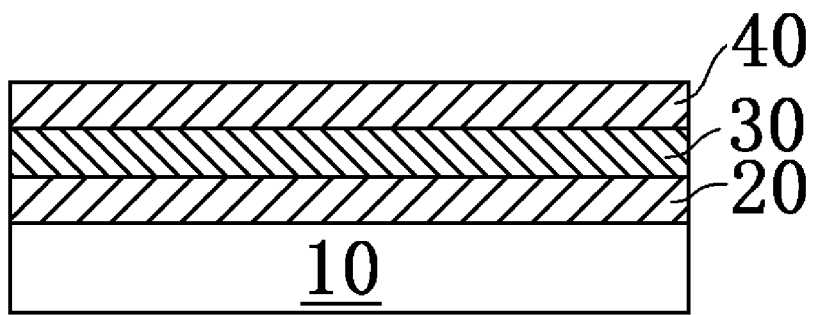

[Fig. 6]
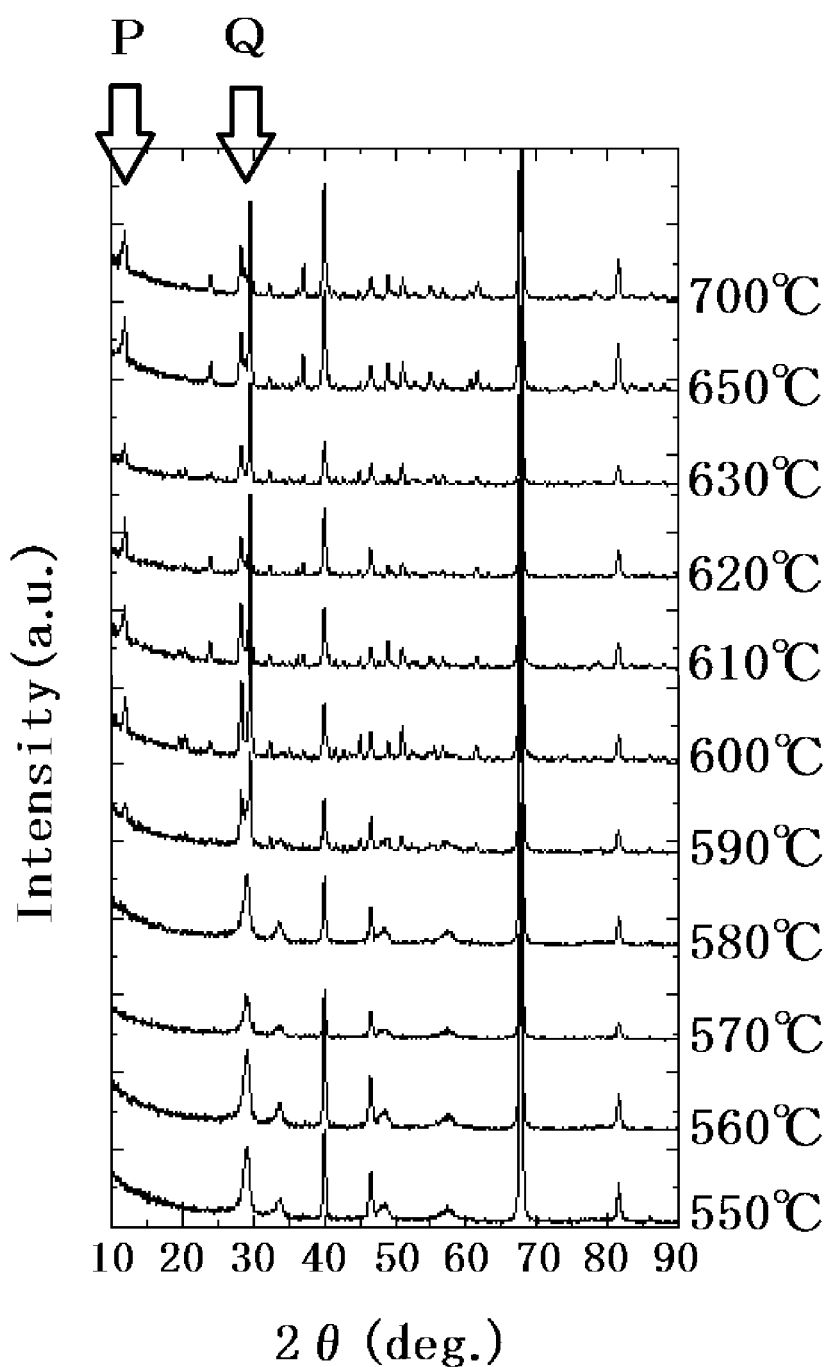

[Fig. 7]
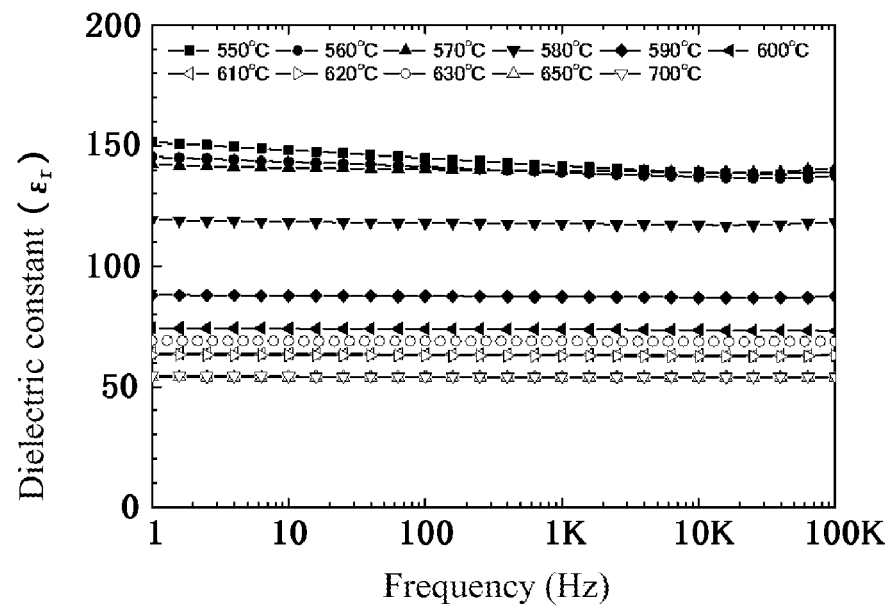
[Fig. 8]
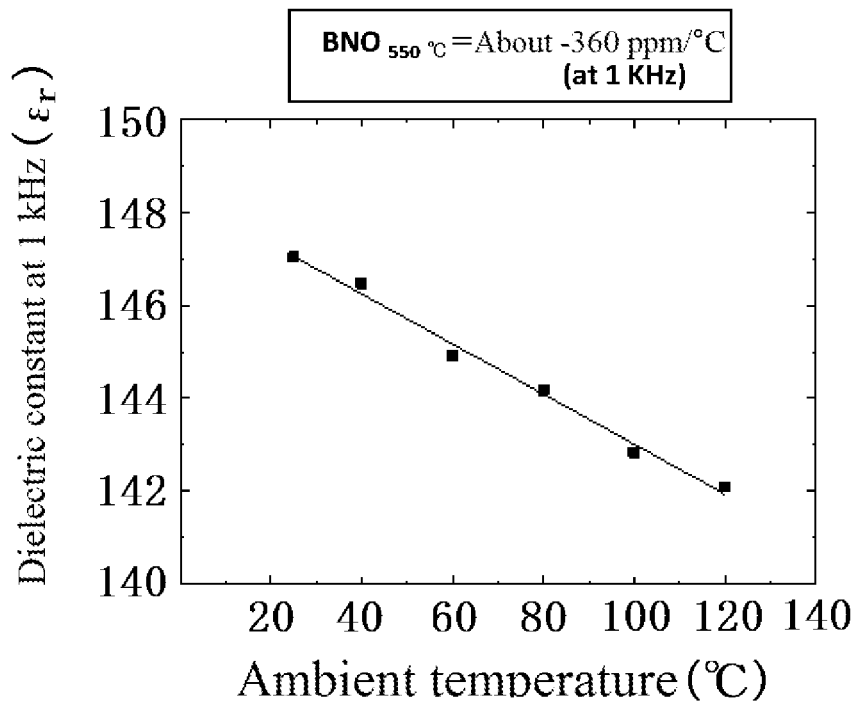

[Fig. 9]
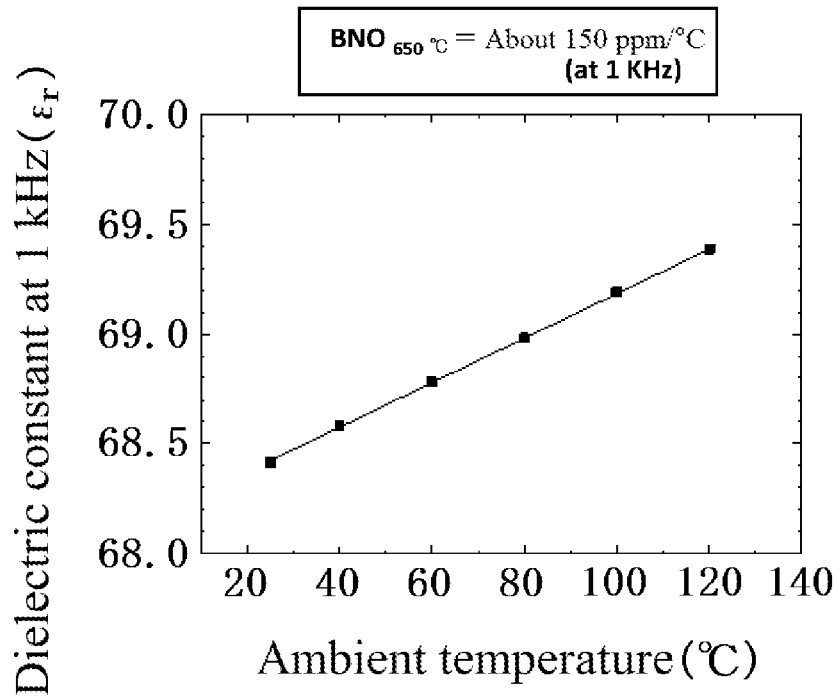
[Fig. 10]
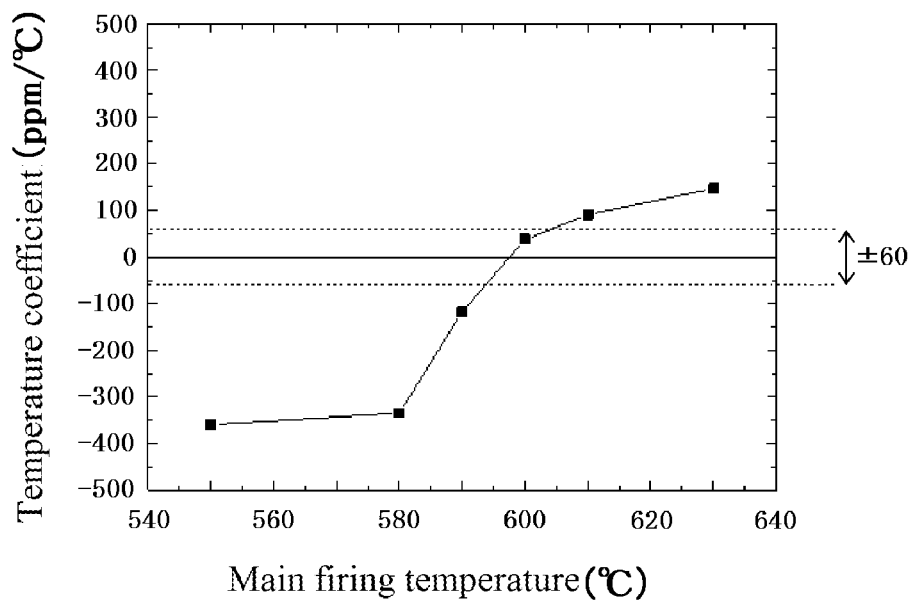

[Fig. 11]
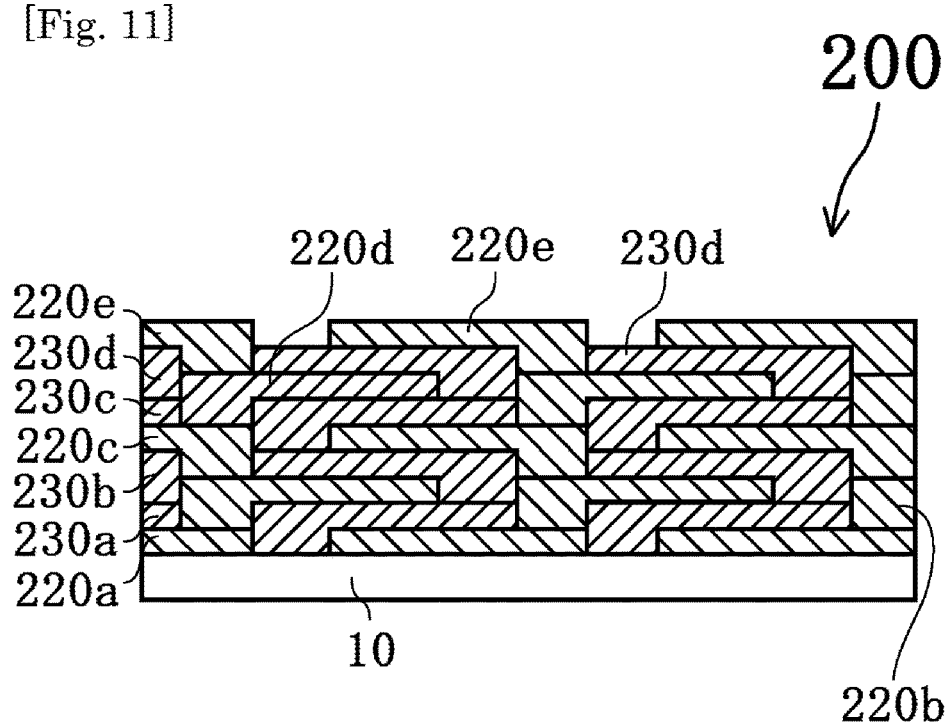
[Fig. 12]
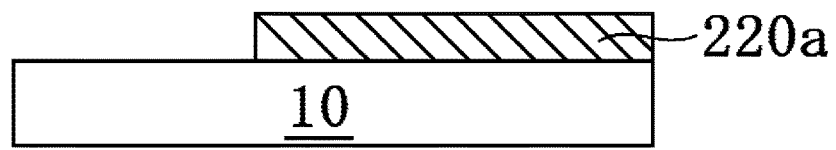

[Fig. 13]
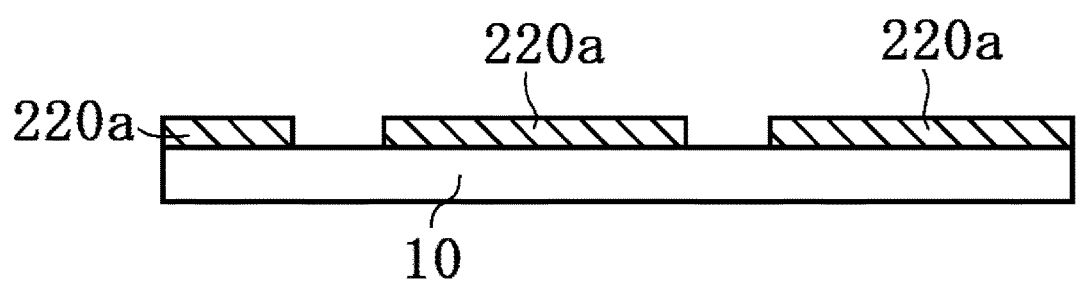

[Fig. 14]
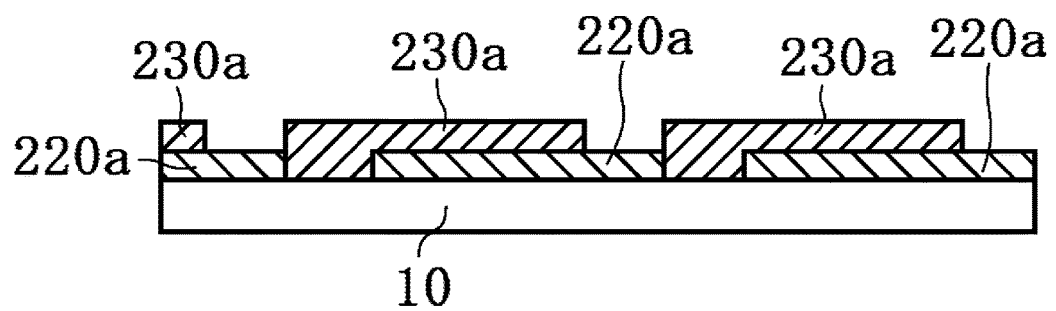

[Fig. 15]
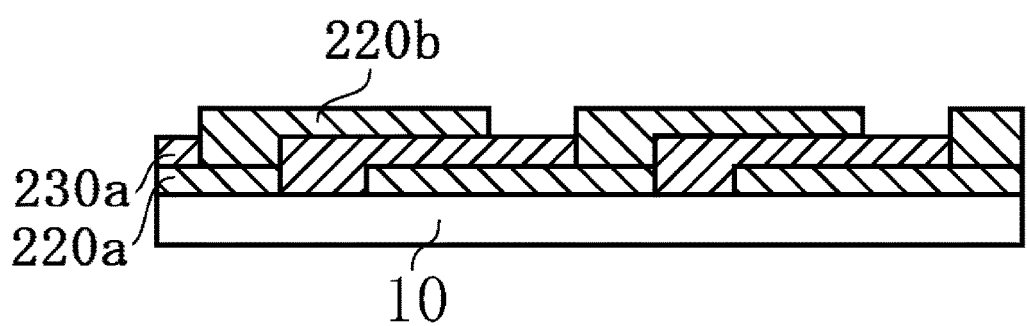

[Fig. 16]
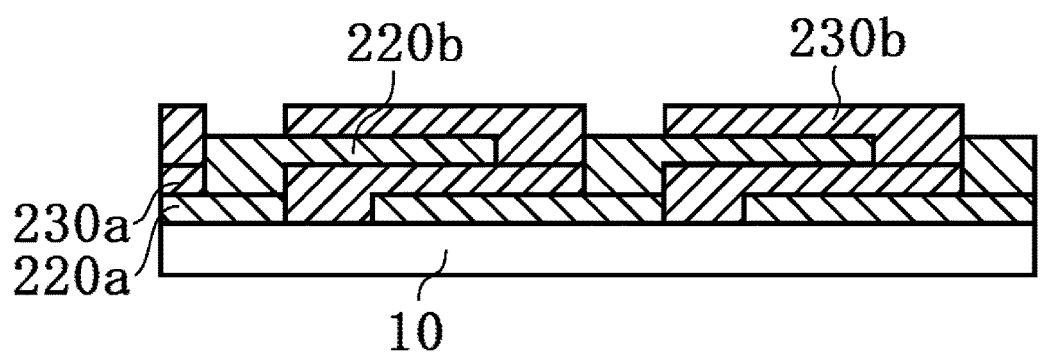

[Fig. 17]
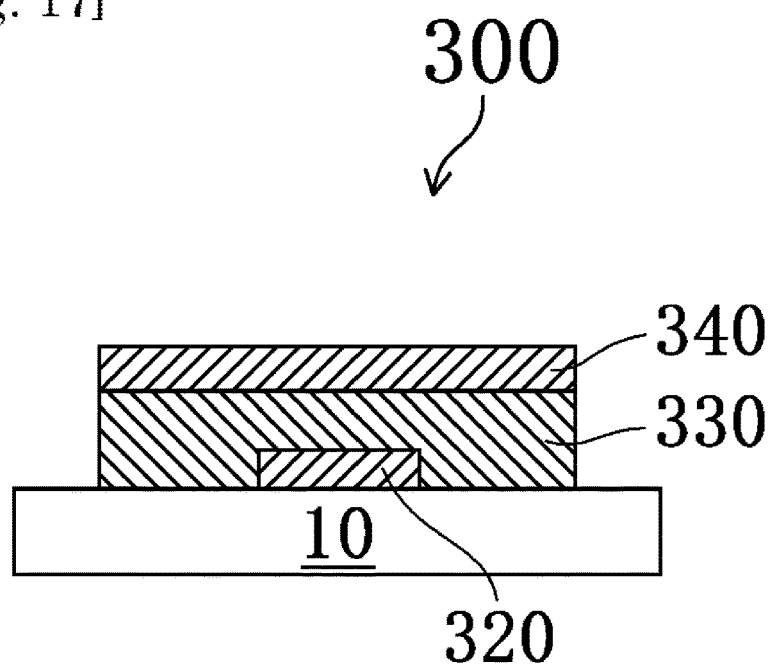
[Fig. 18]
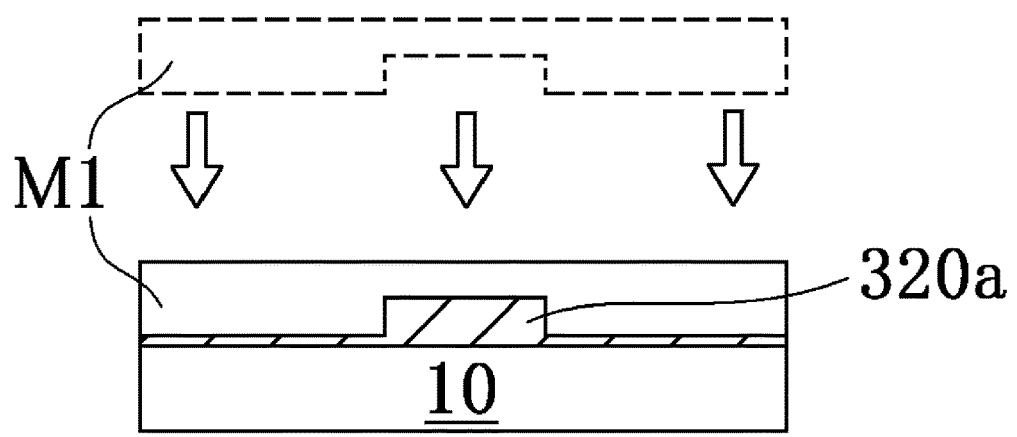

[Fig. 19]
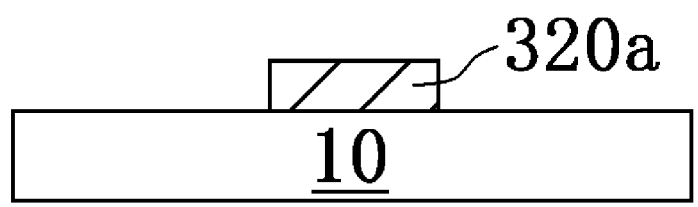
[Fig. 20]
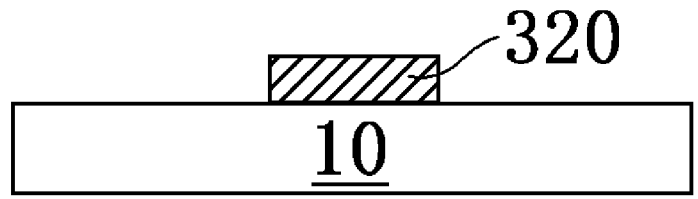

[Fig. 21]
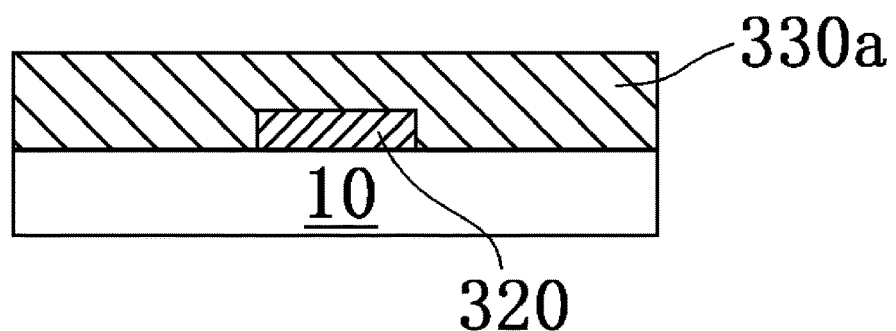
[Fig. 22]
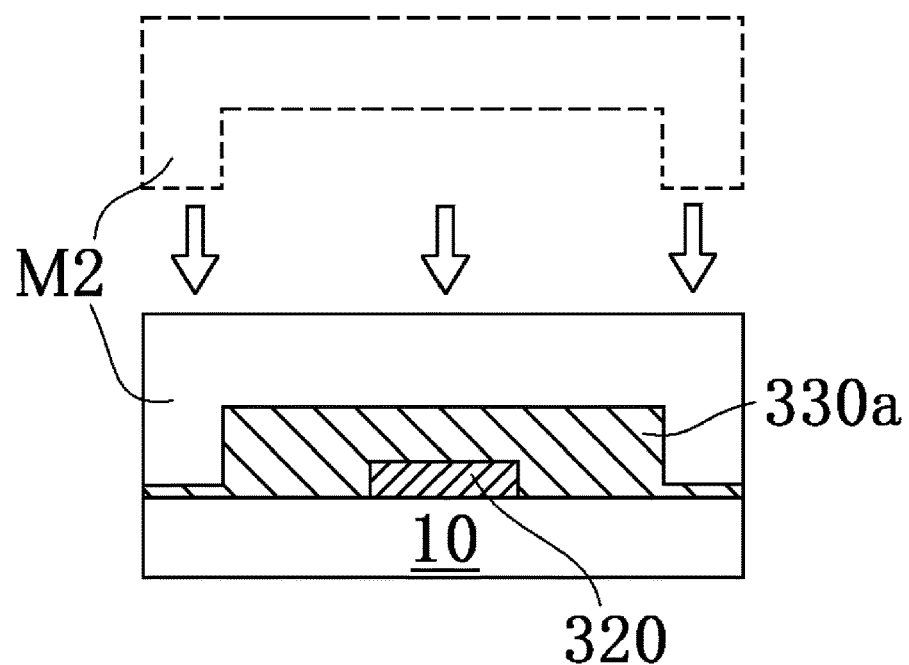

[Fig. 23]
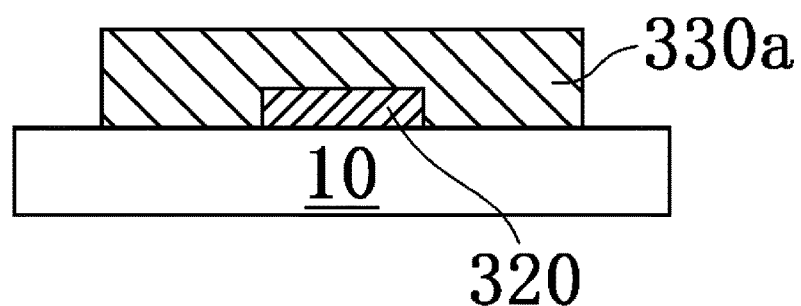
[Fig. 24]
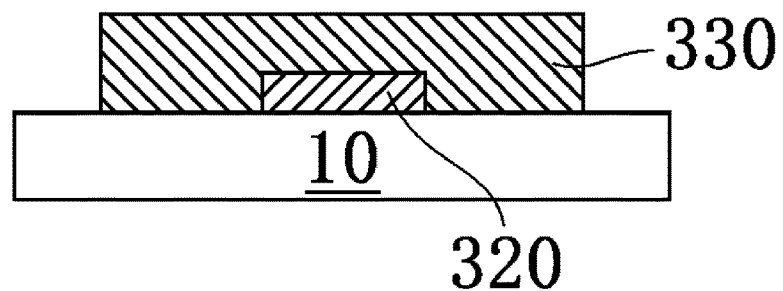

[Fig. 25]
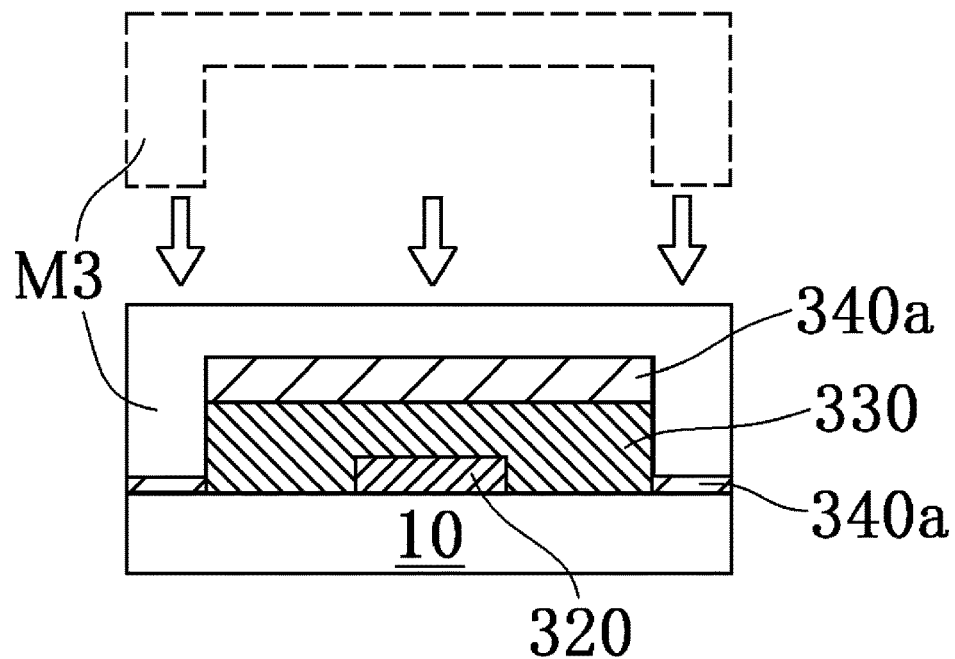
[Fig. 26]
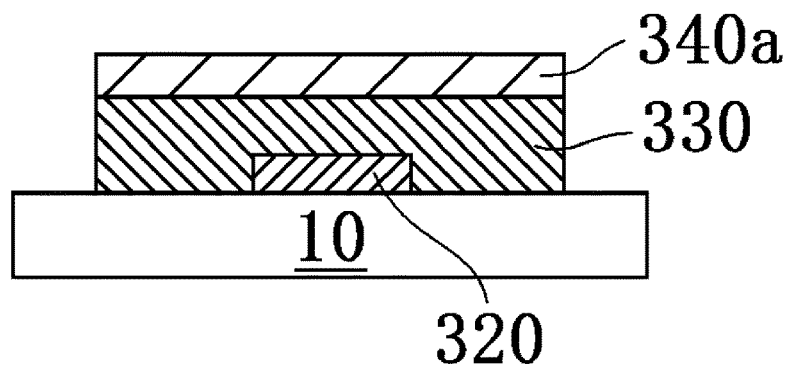

[Fig. 27]
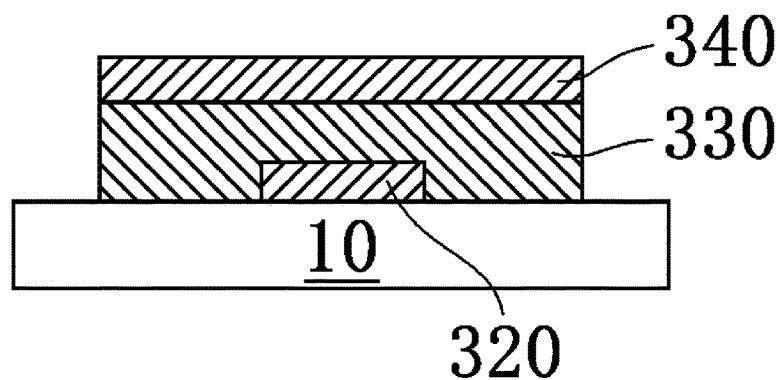
[Fig. 28]
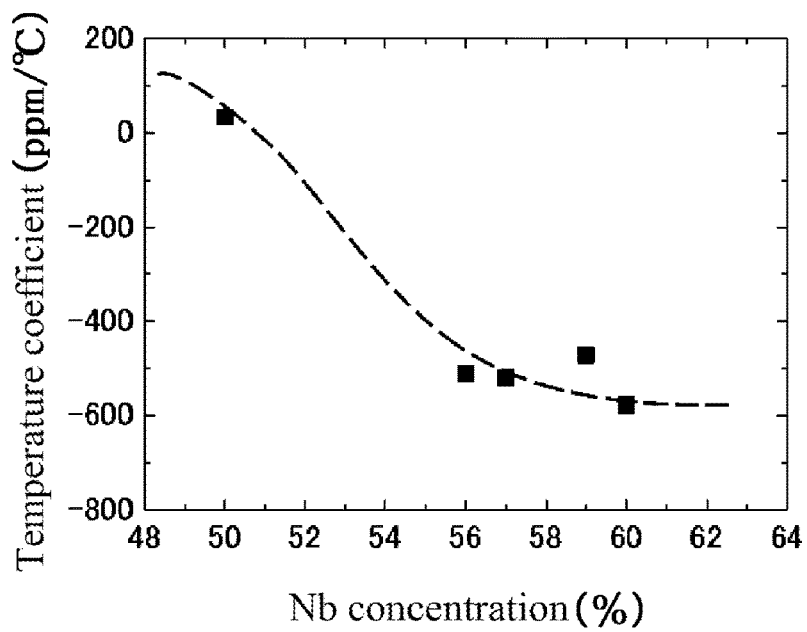

OXIDE DIELECTRIC AND METHOD FOR MANUFACTURING SAME, AND SOLID STATE ELECTRONIC DEVICE AND METHOD FOR MANUFACTURING SAME

CROSS-REFERENCE TO RELATED APPLICATIONS

This application is a national stage application filed under 35 U.S.C. 371 of International Application No. PCT/JP2015/069852, filed Jul. 10, 2015, which claims priority from Japanese Patent Application No. 2014-151942, filed Jul. 25, 2014, each of which is incorporated by reference herein in its entirety.

TECHNICAL FIELD

The present invention relates to an oxide dielectric and a method for manufacturing the same, and to a solid state electronic device and a method for manufacturing the same.

BACKGROUND ART

Functional oxide layers with a variety of compositions have been developed in the art. An example of developed solid state electronic devices with such oxide layers includes ferroelectric thin film-containing devices, which are expected to operate at high speed. $BiNbO_4$ is a Pb-free dielectric material developed for use in solid state electronic devices. $BiNbO_4$ can be formed as an oxide layer by firing at relatively low temperature. As to $BiNbO_4$, there is a report on the dielectric properties of $BiNbO_4$ formed by solid phase growth technique (Non-Patent Document 1). Some patent documents also disclose oxide layers consisting essentially of bismuth (Bi) and niobium (Nb) and having relatively high dielectric constants of 60 or more (up to 180) at 1 kHz (Patent Documents 1 and 2).

PRIOR ART DOCUMENTS

Patent Documents

Patent Document 1: International Publication No. WO 2013/069470 A
Patent Document 2: International Publication No. WO 2013/069471 A

Non-Patent Document

Non-Patent Document 1: Effect of phase transition on the microwave dielectric properties of BiNbO4, Eung Soo Kim, Woong Choi, Journal of the European Ceramic Society 26 (2006) 1761-1766

SUMMARY OF THE INVENTION

Problems to be Solved by the Invention

However, even though an oxide consisting essentially of bismuth (Bi) and niobium (Nb) (hereinafter referred to as a "BNO oxide") and having a relatively high dielectric constant is obtained, such an oxide, when used to increase the performance of solid state electronic devices such as capacitors or condensers (hereinafter collectively referred to as "capacitors"), semiconductor devices, or small electromechanical systems, is required to have, for example, such properties that its dielectric constant is particularly less affected by changes in the surrounding or ambient temperature (hereinafter collectively referred to as "ambient temperature") of the place where these devices (more specifically the BNO oxide) are present or located. Typically, the improvement in the resistance of capacitors to ambient temperature is particularly required in the industrial field.

The improvement in the resistance to ambient temperature is also one of important technical issues for other solid state electronic devices such as a combined device including at least two of a high frequency filter, a patch antenna, a semiconductor device, a small electromechanical system, or an RCL.

In the conventional art, the efficiency of use of raw materials or production energy is also very low because common processes such as vacuum processes and photolithographic processes take a relatively long time and/or require expensive facilities. The use of such manufacturing methods requires many processes and a long time for the manufacture of solid state electronic devices and thus is not preferred in view of industrial or mass productivity. According to the conventional art, there is also a problem in that large-area fabrication is relatively difficult to perform.

The inventions described in the applications filed to date by the inventors propose some solutions to the above technical problems with the conventional art. However, solid state electronic devices with high performance and high reliability are yet to be fully achieved.

Solutions to the Problems

The present invention solves at least one of the above problems so that a high-performance solid state electronic device can be manufactured using an oxide as at least a dielectric or an insulator (hereinafter collectively referred to as a "dielectric") or such a solid state electronic device can be manufactured by a simplified, energy-saving process. As a result, the present invention can significantly contribute to the provision of an oxide dielectric with high industrial or mass productivity and the provision of solid state electronic devices having such an oxide dielectric.

The inventors have conducted intensive studies and analyses on methods for selecting, among many existing oxides, and producing an oxide capable of properly functioning as a dielectric in solid state electronic devices. As a result of detailed analyses and studies and many trials and errors, the inventors have made very interesting findings by focusing on a plurality of crystal phases characteristic of an oxide (possibly including inevitable impurities) including bismuth (Bi) and niobium (Nb). Specifically, the inventors have found that differences in crystal phases in the oxide not only cause the oxide to have different dielectric values but also make great differences in dielectric constant change, which depends on the temperature of the environment where the oxide is placed. As a result, the inventors have found that controlling the contents of various crystal phases in the oxide makes it possible to obtain an oxide and an oxide dielectric having very high resistance to changes in the ambient temperature. In addition, the inventors have found that a high-performance dielectric can be more reliably manufactured by aggressively taking advantage of the characteristic content range in part of a process of manufacturing an oxide dielectric.

The inventors have further found that when a method not requiring a high-vacuum state is employed, an inexpensive and simple manufacturing process can be achieved for the manufacturing method of the oxide dielectric. A typical example of such a manufacturing process is a screen printing process or an imprinting process also called "nanoimprinting." The inventors have also found that an oxide layer consisting essentially of the oxide dielectric can be patterned using each of the inexpensive and simple methods mentioned above. As a result, the inventors have created a high-performance oxide and have also found that the formation of such an oxide dielectric and the manufacture of a solid state electronic device having such an oxide dielectric can be achieved using a process that is significantly simpler and more energy-saving than conventional processes and easily allows large-area fabrication. The present invention has been made based on each of the findings described above.

The present invention is directed to an oxide dielectric being an oxide (possibly including inevitable impurities; hereinafter the same applies to all oxides in the present disclosure) including bismuth (Bi) and niobium (Nb), the oxide dielectric including: a first crystal phase of a pyrochlore-type crystal structure; and a second crystal phase of a $\beta$-BiNbO$_4$-type crystal structure. In addition, the oxide dielectric has a controlled content of the first crystal phase and a controlled content of the second crystal phase, in which the first crystal phase has a dielectric constant that decreases with increasing temperature of the oxide in a temperature range of 25° C. or more and 120° C. or less, and the second crystal phase has a dielectric constant that increases with increasing temperature of the oxide in the temperature range.

The oxide dielectric includes two characteristic crystal phases having, in a sense, opposite temperature characteristics associated with changes in ambient temperature. According to the oxide dielectric, the control of the content of each of these crystal phases makes it possible to obtain an oxide dielectric whose dielectric constant is less affected by changes in the ambient temperature. Therefore, solid state electronic devices including the oxide dielectric have the property of withstanding changes in ambient temperature, in other words, the property of being highly resistant to changes in ambient temperature. Until now, research and development activities have focused mainly on the level of dielectric constant. According to the present disclosure, however, an oxide dielectric with increased resistance to changes in ambient temperature can be achieved by rather taking advantage of the interesting properties of the crystal phase of the $\beta$-BiNbO$_4$-type crystal structure (second crystal phase) with a relatively low dielectric constant. This point is worth noting.

The present invention is also directed to another oxide dielectric being an oxide (possibly including inevitable impurities) including bismuth (Bi) and niobium (Nb) and having a first crystal phase of a pyrochlore-type crystal structure and a second crystal phase of a $\beta$-BiNbO$_4$-type crystal structure. Additionally, in the oxide dielectric, the content of the second crystal phase is 1.43 or more and 4.67 or less when the content of the first crystal phase is assumed to be 1.

According to the oxide dielectric, the ratio of the content of the second crystal phase of the $\beta$-BiNbO$_4$-type crystal structure to the content of the first crystal phase of the pyrochlore-type crystal structure is controlled or kept in the specified range, which makes it possible to obtain an oxide dielectric whose dielectric constant is less affected by changes in ambient temperature. The dielectric of the present invention, which is an oxide including bismuth (Bi) and niobium (Nb), has been created for the first time based on the inventors' findings about the two characteristic crystal phases having, in a sense, opposite temperature characteristics associated with changes in ambient temperature. The characteristics are such that the dielectric constant of the first crystal phase decreases with increasing temperature of the BNO oxide whereas the dielectric constant of the second crystal phase increases with increasing temperature of the BNO oxide, which are interesting results. Therefore, solid state electronic devices including the oxide dielectric have the property of withstanding changes in ambient temperature, in other words, the property of being highly resistant to changes in ambient temperature. Until now, research and development activities have focused mainly on the level of dielectric constant. According to the present disclosure, however, an oxide dielectric with increased resistance to changes in ambient temperature can be achieved by rather taking advantage of the interesting properties of the crystal phase of the $\beta$-BiNbO$_4$-type crystal structure (second crystal phase) with a relatively low dielectric constant. This point is worth noting.

The present invention is also directed to a method for manufacturing an oxide dielectric, the method including: heating, in an oxygen-containing atmosphere, a precursor derived from a precursor solution, as a starting material, comprising a bismuth (Bi)-containing precursor and a niobium (Nb)-containing precursor as solutes, to form an oxide (possibly including inevitable impurities) comprising bismuth (Bi) and niobium (Nb). Additionally, the oxide dielectric manufacturing method includes a heating step to control contents of a first crystal phase of a pyrochlore-type crystal structure and a second crystal phase of a $\beta$-BiNbO$_4$-type crystal structure, the first crystal phase of the pyrochlore-type crystal structure having a dielectric constant that decreases with increasing temperature of the oxide (possibly including inevitable impurities) in a temperature range of 25° C. or more and 120° C. or less; and the second crystal phase of the $\beta$-BiNbO$_4$-type crystal structure having a dielectric constant that increases with increasing temperature of the oxide in a temperature range of 25° C. or more and 120° C. or less.

According to the oxide dielectric manufacturing method, the precursor is heated in such a manner as to control or keep the contents of the two characteristic crystal phases having, in a sense, opposite temperature characteristics associated with changes in ambient temperature, so that the manufactured oxide dielectric can have a dielectric constant less affected by changes in the ambient temperature. Therefore, solid state electronic devices including the oxide dielectric have the property of withstanding changes in ambient temperature, in other words, the property of being highly resistant to changes in ambient temperature. Until now, research and development activities have focused mainly on the level of dielectric constant. According to the present disclosure, however, an oxide dielectric with increased resistance to changes in ambient temperature can be manufactured by rather taking advantage of the interesting properties of the crystal phase of the $\beta$-BiNbO$_4$-type crystal structure (second crystal phase) with a relatively low dielectric constant. This point is worth noting.

The present invention is also directed to another method for manufacturing an oxide dielectric, the method including: heating, in an oxygen-containing atmosphere, a precursor derived from a precursor solution, as a starting material, comprising a bismuth (Bi)-containing precursor and a niobium (Nb)-containing precursor as solutes, to form an oxide (possibly including inevitable impurities) comprising bismuth (Bi) and niobium (Nb), the oxide comprising: a first crystal phase of a pyrochlore-type crystal structure and a second crystal phase of a $\beta$-BiNbO$_4$-type crystal structure.

Additionally, the oxide dielectric manufacturing method includes, in the case of forming the oxide by heating, a heating step performed in such a manner that a content of the second crystal phase of the β-BiNbO$_4$-type crystal structure is controlled to be 1.43 or more and 4.67 or less when a content of a first crystal phase of a pyrochlore-type crystal structure is assumed to be 1.

According to the oxide dielectric manufacturing method, the precursor is heated in such a manner as to control or keep, in the specified range, the ratio of the content of the second crystal phase of the 1βBiNbO$_4$-type crystal structure to the content of the first crystal phase of the pyrochlore-type crystal structure, so that the manufactured oxide dielectric can have a dielectric constant less affected by changes in the ambient temperature. The oxide dielectric manufacturing method has been created for the first time based on the inventors' findings about the relationship between the two characteristic crystal phases having, in a sense, opposite temperature characteristics associated with changes in ambient temperature. The characteristics are such that the dielectric constant of the first crystal phase decreases with increasing temperature of the BNO oxide whereas the dielectric constant of the second crystal phase increases with increasing temperature of the BNO oxide, which are interesting results. Therefore, solid state electronic devices including the oxide dielectric have the property of withstanding changes in ambient temperature, in other words, the property of being highly resistant to changes in ambient temperature. Until now, research and development activities have focused mainly on the level of dielectric constant. According to the present disclosure, however, an oxide dielectric with increased resistance to changes in ambient temperature can be manufactured by rather taking advantage of the interesting properties of the crystal phase of the β-BiNbO$_4$-type crystal structure (second crystal phase) with a relatively low dielectric constant. This point is worth noting.

In each oxide dielectric manufacturing method described above, the content of each crystal phase can be controlled by the temperature and/or time of heating of the precursor derived from the starting material, which is the precursor solution including the bismuth (Bi)-containing precursor and the niobium (Nb)-containing precursor as solutes.

Also in each oxide dielectric manufacturing method described above, the oxide layer can be formed using a relatively-simple, non-photolithographic process (such as an inkjet method, a screen printing method, an intaglio/relief printing method, or a nanoimprinting method). This can eliminate the need to perform a process that takes a relatively long time and/or requires an expensive facility, such as a process using a vacuum. Thus, each oxide layer manufacturing method described above has high industrial or mass productivity.

As used herein, the term "in an oxygen-containing atmosphere" means in an oxygen atmosphere or in the air.

As to each aspect of the present invention described above, the mechanism or reason why the crystal phase of the pyrochlore-type crystal structure (first crystal phase) can be formed in the BNO oxide is not clear at present. However, the interesting heterogeneity of the first crystal phase and the two characteristic crystal phases (first and second crystal phases) having, in a sense, opposite temperature characteristics associated with changes in ambient temperature work together to make it possible to obtain electrical properties that have never been obtained before.

In each aspect of the present invention described above, the oxide may further include an amorphous phase of an oxide including bismuth (Bi) and niobium (Nb). As compared with the case of only an aggregate of microcrystals, the amorphous phase-containing oxide is a preferred mode for reliably preventing degradation or variations in electrical properties, which would otherwise be caused by the formation of unnecessary grain boundaries.

Effects of the Invention

In an oxide dielectric according to the present invention, the content of each of the two characteristic crystal phases having, in a sense, opposite temperature characteristics associated with changes in ambient temperature is controlled, or the ratio between the contents of the two characteristic crystal phases is kept in the specified range. These features of the present invention make it possible to manufacture an oxide dielectric having a dielectric constant less affected by changes in the ambient temperature.

In a method for manufacturing an oxide dielectric according to the present invention, the precursor is heated in such a manner that the content of each of the two characteristic crystal phases having, in a sense, opposite temperature characteristics associated with changes in ambient temperature is controlled, or the ratio between the contents of the two characteristic crystal phases is kept in the specified range. These features of the present invention make it possible to manufacture an oxide dielectric having a dielectric constant less affected by changes in the ambient temperature.

BRIEF DESCRIPTION OF THE DRAWINGS

FIG. 1 is a view showing the overall structure of a thin film capacitor as an example of a solid state electronic device in First Embodiment of the present invention.

FIG. 2 is a cross-sectional schematic view showing a process in a method for manufacturing a thin film capacitor in First Embodiment of the present invention.

FIG. 3 is a cross-sectional schematic view showing a process in the method for manufacturing the thin film capacitor in First Embodiment of the present invention.

FIG. 4 is a cross-sectional schematic view showing a process in the method for manufacturing the thin film capacitor in First Embodiment of the present invention.

FIG. 5 is a cross-sectional schematic view showing a process in the method for manufacturing the thin film capacitor in First Embodiment of the present invention.

FIG. 6 is a graph showing the change in the results of X-ray diffraction (XRD) measurement to determine the crystal structure of a BNO oxide with different firing temperatures for the BNO oxide in First Embodiment of the present invention.

FIG. 7 is a graph showing the change in the frequency characteristics of the dielectric constant with different firing temperatures for the BNO oxide in First Embodiment of the present invention.

FIG. 8 is a graph showing a correlation between the ambient temperature and the dielectric constant of a BNO oxide obtained at a firing temperature of 550° C. in First Embodiment of the present invention.

FIG. 9 is a graph showing a correlation between the ambient temperature and the dielectric constant of a BNO oxide obtained at a firing temperature of 650° C. in First Embodiment of the present invention.

FIG. 10 is a graph showing the relationship between the main firing temperature and the temperature coefficient of the dielectric constant in First Embodiment of the present invention.

FIG. 11 is a view showing the overall structure of a multilayer capacitor as an example of a solid state electronic device in Second Embodiment of the present invention.

FIG. 12 is a cross-sectional schematic view showing a process in a method for manufacturing a multilayer capacitor as an example of a solid state electronic device in Second Embodiment of the present invention.

FIG. 13 is a cross-sectional schematic view showing a process in the method for manufacturing the multilayer capacitor as the example of the solid state electronic device in Second Embodiment of the present invention.

FIG. 14 is a cross-sectional schematic view showing a process in the method for manufacturing the multilayer capacitor as the example of the solid state electronic device in Second Embodiment of the present invention.

FIG. 15 is a cross-sectional schematic view showing a process in the method for manufacturing the multilayer capacitor as the example of the solid state electronic device in Second Embodiment of the present invention.

FIG. 16 is a cross-sectional schematic view showing a process in the method for manufacturing the multilayer capacitor as the example of the solid state electronic device in Second Embodiment of the present invention.

FIG. 17 is a cross-sectional schematic view showing a process in a method for manufacturing a multilayer capacitor as an example of a solid state electronic device in Third Embodiment of the present invention.

FIG. 18 is a cross-sectional schematic view showing a process in the method for manufacturing the multilayer capacitor as the example of the solid state electronic device in Third Embodiment of the present invention.

FIG. 19 is a cross-sectional schematic view showing a process in the method for manufacturing the multilayer capacitor as the example of the solid state electronic device in Third Embodiment of the present invention.

FIG. 20 is a cross-sectional schematic view showing a process in the method for manufacturing the multilayer capacitor as the example of the solid state electronic device in Third Embodiment of the present invention.

FIG. 21 is a cross-sectional schematic view showing a process in the method for manufacturing the multilayer capacitor as the example of the solid state electronic device in Third Embodiment of the present invention.

FIG. 22 is a cross-sectional schematic view showing a process in the method for manufacturing the multilayer capacitor as the example of the solid state electronic device in Third Embodiment of the present invention.

FIG. 23 is a cross-sectional schematic view showing a process in the method for manufacturing the multilayer capacitor as the example of the solid state electronic device in Third Embodiment of the present invention.

FIG. 24 is a cross-sectional schematic view showing a process in the method for manufacturing the multilayer capacitor as the example of the solid state electronic device in Third Embodiment of the present invention.

FIG. 25 is a cross-sectional schematic view showing a process in the method for manufacturing the multilayer capacitor as the example of the solid state electronic device in Third Embodiment of the present invention.

FIG. 26 is a cross-sectional schematic view showing a process in the method for manufacturing the multilayer capacitor as the example of the solid state electronic device in Third Embodiment of the present invention.

FIG. 27 is a cross-sectional schematic view showing a process in the method for manufacturing the multilayer capacitor as the example of the solid state electronic device in Third Embodiment of the present invention.

FIG. 28 is a graph showing the relationship between the temperature coefficient (ppm/° C.) of the dielectric constant obtained at a main firing temperature of 600° C. in First Embodiment of the present invention and the concentration (%) of niobium (Nb) in a precursor solution in First Embodiment.

DESCRIPTION OF REFERENCE SIGNS

10: Substrate
20, 320: Lower electrode layer
220a, 220b, 220c, 220d: Electrode layer
221a: Precursor layer for electrode layer
320a: Precursor layer for lower electrode layer
320: Lower electrode layer
30, 230a, 330: Oxide layer (oxide dielectric layer)
30a, 330a: Precursor layer
340a: Precursor layer for upper electrode layer
40, 340: Upper electrode layer
100, 300: Thin film capacitor as an example of solid state electronic device
200: Multilayer capacitor as an example of solid state electronic device
M1: Lower electrode layer-forming mold
M2: Dielectric layer-forming mold
M3: Upper electrode layer-forming mold

EMBODIMENTS OF THE INVENTION

A solid state electronic device according to an embodiment of the present invention will be described with reference to the attached drawings. For the description, common reference signs are attached to common parts throughout the drawings, unless otherwise stated. In the drawings, elements of the embodiments are not always shown to scale. Some of the reference sings may also be omitted for clear view of each drawing.

First Embodiment

1. Overall Structure of Thin Film Capacitor of this Embodiment

FIG. 1 is a view showing the overall structure of a thin film capacitor 100 as an example of the solid state electronic device according to this embodiment. As shown in FIG. 1, the thin film capacitor 100 includes a lower electrode layer 20, an oxide dielectric layer (hereinafter, it is also abbreviated as an "oxide layer," and the same applies hereinafter) 30, and an upper electrode layer 40, which are formed on a substrate 10 and arranged in order from the substrate 10 side.

The substrate 10 may be, for example, any of various insulating substrates, including a highly heat-resistant glass substrate, a $SiO_2/Si$ substrate, an alumina ($Al_2O_3$) substrate, an STO (SrTiO) substrate, an insulating substrate including a Si substrate and an STO (SrTiO) layer formed on the surface of the Si substrate with a $SiO_2$ layer and a Ti layer disposed between the substrate and the STO layer, an insulating substrate including a Si substrate and a $SiO_2$ layer and a $TiO_x$ layer stacked in this order on the surface of the Si substrate, and a semiconductor substrate (such as a Si substrate, a SiC substrate, or a Ge substrate).

The lower electrode layer 20 and the upper electrode layer 40 may each be made of a metallic material such as a high-melting-point metal such as platinum, gold, silver, copper, aluminum, molybdenum, palladium, ruthenium, iridium, or tungsten, or any alloy thereof.

In this embodiment, the oxide dielectric layer (oxide layer 30) is formed by a process that includes providing, as a starting material, a precursor solution containing a bismuth (Bi)-containing precursor and a niobium (Nb)-containing precursor as solutes; and heating the precursors in an oxygen-containing atmosphere (hereinafter, the manufacturing method using this process will also be referred to as the "solution process"). In this embodiment, for example, bismuth 2-ethylhexanoate and niobium 2-ethylhexanoate may be used as the solutes in the precursor solution.

The oxide layer 30 including bismuth (Bi) and niobium (Nb) can be obtained using a precursor layer made from the precursor solution as a starting material (also simply referred to as the "precursor layer"). More specifically, the oxide layer 30 in this embodiment includes an oxide including bismuth (Bi) and niobium (Nb) and having a crystal phase of a pyrochlore-type crystal structure (a first crystal phase) and/or an oxide including bismuth (Bi) and niobium (Nb) and having a crystal phase of a $BiNbO_4$-type crystal structure (a second crystal phase). In this regard, each crystal phase mentioned above may include a microcrystal phase.

The inventors have obtained the findings below on the crystal phase of the pyrochlore-type crystal structure (the first crystal phase) by analyzing the cross-sectional transmission electron microscopy (TEM) photograph and electron beam diffraction image of the BNO oxide layer (oxide layer 30).

Using the electron beam diffraction image of the oxide layer 30, the inventors have carried out structural analysis by determining the Miller indices and the interatomic distances and then fitting known crystal structure models to the determined values. As a result, the inventors have found that the crystal phase of the pyrochlore-type crystal structure in the oxide layer 30 in this embodiment is a $(Bi_{1.5}Zn_{0.5})(Zn_{0.5}Nb_{1.5})O_7$-type structure or substantially equal or close to a $(Bi_{1.5}Zn_{0.5})(Zn_{0.5}Nb_{1.5})O_7$ type structure.

General pyrochlore-type crystal structures known to date can be obtained as a result of the presence of "zinc." In this embodiment, however, the results are obtained in a different setting. At present, it is not clear why such a pyrochlore-type crystal structure can be produced with a zinc-free composition. As described below, however, it has been found that the presence of the crystal phase of the pyrochlore-type crystal structure leads to good dielectric properties (in particular, high dielectric constants) of dielectric layers in thin layer capacitors or multilayer capacitors or good dielectric properties of insulating layers in various other solid state electronic devices (e.g., semiconductor devices or small electromechanical systems).

It has also been found that, depending on firing temperature, the oxide layer 30 in this embodiment can also have an amorphous phase and a crystal phase of a $Bi_3NbO_7$-type crystal structure (a third crystal phase) in addition to the first crystal phase and/or the second crystal phase. Such coexistence of various crystal phases and an amorphous phase is a preferred mode for reliably preventing degradation or variations in electrical properties, which would otherwise be caused by the formation of unnecessary grain boundaries.

This embodiment is not limited to the structure shown in FIG. 1. For simplification of drawings, the drawings omit to show the patterning of an extraction electrode layer from each electrode layer.

2. Method for Manufacturing Thin Film Capacitor 100

Next, a method for manufacturing the thin film capacitor 100 will be described. Note that the temperature values shown in the description each indicate the heater set temperature. FIGS. 2 to 5 are cross-sectional schematic views each showing a process in the method for manufacturing the thin film capacitor 100. As shown in FIG. 2, a lower electrode layer 20 is first formed on a substrate 10. Subsequently, after an oxide layer 30 is formed on the lower electrode layer 20, an upper electrode layer 40 is formed on the oxide layer 30.

(1) Formation of Lower Electrode Layer

FIG. 2 is a view showing the step of forming the lower electrode layer 20. This embodiment provides an example where the lower electrode layer 20 of the thin film capacitor 100 is made of platinum (Pt). The lower electrode layer 20 is a layer (e.g., 200 nm thick) formed of platinum (Pt) on the substrate 10 by a known sputtering method.

(2) Formation of Oxide Layer as Insulting Layer

Subsequently, the oxide layer 30 is formed on the lower electrode layer 20. The oxide layer 30 is formed by sequentially performing the steps of (a) forming a precursor layer and then subjecting the precursor layer to preliminary firing, and (b) subjecting the preliminarily fired layer to main firing. FIGS. 3 to 5 are views showing the process of forming the oxide layer 30. An example will be described where in the process of manufacturing the thin film capacitor 100 according to this embodiment, the oxide layer 30 includes an oxide including bismuth (Bi) and niobium (Nb) and having at least a crystal phase of a pyrochlore-type crystal structure (a first crystal phase) and/or a crystal phase of a $\beta$-$BiNbO_4$-type crystal structure (a second crystal phase).

(a) Formation of Precursor Layer and Preliminary Firing

A precursor solution containing a bismuth (Bi)-containing precursor (also referred to as precursor A) and a niobium (Nb)-containing precursor (also referred to as precursor B) as solutes is used as a starting material (such a precursor solution containing precursors A and B is referred to as a precursor solution; hereinafter, the same applies to solutions of precursors). As shown in FIG. 3, a layer 30a of a precursor derived from the starting material (such a layer and such a precursor are also referred to as the "precursor layer" and "precursor C") are formed on the lower electrode layer 20 by a known spin coating method.

In this embodiment, examples of the bismuth (Bi)-containing precursor (precursor A) for the oxide layer 30 include not only bismuth 2-ethylhexanoate mentioned above, but also bismuth octylate, bismuth chloride, bismuth nitrate, or various bismuth alkoxides (e.g., bismuth isopropoxide, bismuth butoxide, bismuth ethoxide, and bismuth methoxyethoxide). In this embodiment, examples of the niobium (Nb)-containing precursor (precursor B) in the oxide layer 30 include not only niobium 2-ethylhexanoate mentioned above, but also niobium octylate, niobium chloride, niobium nitrate, or various niobium alkoxides (e.g., niobium isopropoxide, niobium butoxide, niobium ethoxide, and niobium methoxyethoxide). The solvent of the precursor solution is preferably at least one alcohol solvent selected from the group consisting of ethanol, propanol, butanol, 2-methoxyethanol, 2-ethoxyethanol, and 2-butoxyethanol, or at least one carboxylic acid solvent selected from the group consisting of acetic acid, propionic acid, and octylic acid. In a mode, therefore, the solvent of the precursor solution may also be a mixed solvent of two or more of the above alcohol or carboxylic acid solvents.

In this embodiment, the precursor solution is produced by mixing first and second solutions (1) and (2) shown below.
(1) First solution formed by mixing a solution obtained by diluting bismuth 2-ethylhexanoate with 1-butanol, and a solution obtained by diluting bismuth 2-ethylhexanoate with 2-methoxyethanol.

(2) Second solution formed by mixing a solution obtained by diluting niobium 2-ethylhexanoate with 1-butanol, and a solution obtained by diluting niobium 2-ethylhexanoate with 2-methoxyethanol.

In this embodiment, the precursor solution is prepared in such a way that the number of niobium (Nb) atoms is 1 when the number of bismuth (Bi) atoms is assumed to be 1.

Subsequently, preliminary firing is performed in an oxygen-containing atmosphere at a temperature in the range of 80° C. or more and 250° C. or less for a certain period of time. The preliminary firing sufficiently vaporizes the solvent (typically the main solvent) from the precursor layer 30a and forms a preferred gel state (considered to be a state in which organic chains remain before thermal decomposition) in order to produce properties that will enable plastic deformation in the future. The formation of such a gel state makes it easier to form a film by imprinting or screen printing as a method for the film-forming step described below. To achieve this effect more reliably, the preliminary firing temperature is preferably 80° C. or more and 250° C. or less. The formation of the precursor layer 30a by the spin coating method and the preliminary firing may be repeated a plurality of times, so that the oxide layer 30 can be formed with a desired thickness.

(b) Main Firing

In this embodiment, a heating step for main firing is then performed, in which the precursor layer 30a is heated in an oxygen atmosphere (which is typically, but not limited to, 100% by volume of oxygen) at a temperature in the range of 550° C. or more and 700° C. or less (first temperature) for a certain period of time (e.g., 20 minutes). As a result, as shown in FIG. 4, a layer of an oxide including bismuth (Bi) and niobium (Nb) (oxide layer 30) is formed (e.g., with a thickness of 170 nm) on the electrode layer.

In this regard, the thickness of the oxide layer 30 is preferably in the range of 30 nm or more. If the thickness of the oxide layer 30 is decreased to less than 30 nm, leakage current and dielectric loss can increase due to the decrease in the thickness, which is not practical for solid state electronic device applications and thus is not preferred.

(3) Formation of Upper Electrode Layer

Subsequently, the upper electrode layer 40 is formed on the oxide layer 30. FIG. 5 is a view showing the step of forming the upper electrode layer 40. This embodiment provides an example where the upper electrode layer 40 of the thin film capacitor 100 is made of platinum (Pt). Like the lower electrode layer 20, the upper electrode layer 40 is a layer (e.g., 150 nm thick) formed of platinum (Pt) on the oxide layer 30 by a known sputtering method. The thin film capacitor 100 shown in FIG. 1 is obtained after the formation of the upper electrode layer 40.

In this embodiment, the main firing temperature (first temperature) is set at 550° C. or more and 700° C. or less in the step of forming the BNO oxide. However, the first temperature is not limited to this range. On the other hand, very interestingly, the inventors have found that changing the main firing temperature or the heating temperature at least in this range can change not only the dielectric constant value of the BNO oxide but also the ambient temperature dependence of the dielectric constant.

In addition, when the method according to this embodiment is used to form the oxide layer, the precursor solution for the oxide layer is simply heated in an oxygen-containing atmosphere without using any vacuum process, which makes it easy to perform large-area fabrication as compared to conventional sputtering and also makes it possible to significantly increase the industrial or mass productivity.

3. Electrical Properties of Thin Film Capacitor 100

The inventors' study and analysis have shown that in the heating step described above, as the temperature of heating (main firing) for converting the precursor layer 30a into the oxide layer 30 increases from 550° C. to 700° C., the crystal phase of the pyrochlore-type crystal structure disappears whereas the β-BiNbO$_4$ crystal structure becomes more likely to appear. It has also been found that different main firing temperatures allow the BNO oxide to have not only different dielectric constant values but also different ambient temperature dependences of the dielectric constant. It is particularly interesting that the ambient temperature dependence of the dielectric constant of the BNO oxide obtained at a main firing temperature of 550° C. is completely different from (in a sense, opposite to) the ambient temperature dependence of the dielectric constant of the BNO oxide obtained at a main firing temperature of 650° C. Hereinafter, the results of the inventors' analysis will be described in more detail.

FIG. 6 is a graph showing the change in the results of X-ray diffraction (XRD) measurement to determine the crystal structure of the BNO oxide with different firing temperatures for the BNO oxide in this embodiment. FIG. 7 is a graph showing the change in the frequency characteristics of the dielectric constant with different firing temperatures for the BNO oxide in this embodiment. FIG. 8 is a graph showing a correlation between the ambient temperature and the dielectric constant (at a frequency of 1 kHz) of the BNO oxide obtained at a firing temperature of 550° C. in this embodiment. FIG. 9 is also a graph showing a correlation between the ambient temperature and the dielectric constant (at a frequency of 1 kHz) of the BNO oxide obtained at a firing temperature of 650° C. in this embodiment.

First, referring to FIG. 6, it has been found that different main firing temperatures make a difference in status of occurrence of respective peaks, particularly as indicated by the arrows P and Q. More specifically, it is apparent that the peak at a 2θ value of around 13° on the X-axis occurs when the main firing temperature is 580° C. or more (or more precisely 590° C. or more). It is also apparent that a single peak occurs at a 2θ value of around 28° to 29° when the main firing temperature is less than 590° C., whereas two peaks occurs when the main firing temperature is 590° C. or more.

Additionally, as shown in FIG. 7, it has been found that the dielectric constant value measured in the frequency range of 1 Hz to 100 kHz tends to decrease as the main firing temperature increases. This tendency has been observed as a general tendency in the measured temperature range although it is not clear at present why the dielectric constant value for 630° C. is slightly higher than that for 620° C.

The inventors have analyzed the results shown in FIGS. 6 and 7 in combination with the results of the cross-sectional TEM and the electron beam diffraction image. As a result, the inventors have concluded that the status of occurrence of the respective peaks indicated by the arrows P and Q suggests that as the main firing temperature increases, the BNO oxide changes from one in which the crystal phase of the pyrochlore-type crystal structure (first crystal phase) exhibiting a very high dielectric constant is dominant to one in which the crystal phase of the β-BiNbO$_4$ crystal structure (second crystal phase) exhibiting a relatively low dielectric constant is dominant.

Particularly in the range of 1 kHz or more, there is almost no difference between the dielectric constant values obtained at main firing temperatures from 550° C. to 570° C. and between the dielectric constant values obtained at main firing temperatures from 650° C. to 700° C. This fact suggests that the change from the dominance of the first crystal phase to the dominance of the second crystal phase occurs in the temperature range of more than 570° C. and less than 650° C. It is also conceivable that at least in the temperature range of more than 570° C. and less than 650° C., the resulting layer of the oxide including bismuth (Bi) and niobium (Nb) can have an amorphous phase and/or a crystal phase of a structure other than the pyrochlore-type crystal structure and the β-BiNbO$_4$-type crystal structure (e.g., a crystal phase of a Bi$_3$NbO$_7$-type crystal structure (a third crystal phase)) and that such an amorphous phase and/or such a crystal phase can contribute to the dielectric constant of the entire BNO oxide layer. In this regard, however, the analysis conducted by the inventors shows at present that the sum of the contents of the first and second crystal phases is more than 40% of the entire BNO oxide even when it contains the third crystal phase of the Bi$_3$NbO$_7$-type crystal structure and the amorphous phase. The BNO oxide formed by the main firing in the temperature range of more than 570° C. and less than 650° C., which is considered to contain both the first and second crystal phases, has a dielectric constant (dielectric constant at a frequency of 1 kHz) of about 54 or more and about 140 or less.

Thus, the inventors have examined the change in the dielectric constant (dielectric constant at a frequency of 1 kHz) of the BNO oxide with changing ambient temperature in the range of 25° C. or more and 120° C. or less with respect to the BNO oxide obtained by main firing at 650° C., which consists dominantly of the second crystal phase exhibiting a relatively low dielectric constant, and the BNO oxide obtained by main firing at 550° C., which consists dominantly of the first crystal phase exhibiting a high dielectric constant.

As a result, it has been found that as shown in FIGS. 8 and 9, the dielectric constant of the BNO oxide obtained by main firing at 550° C. decreases almost linearly with increasing temperature of the BNO oxide. It has also been found that the dielectric constant of the BNO oxide obtained by main firing at 650° C. increases almost linearly with increasing temperature of the BNO oxide. In other words, the dielectric constants of the BNO oxides obtained by main firing at 550° C. and 650° C., respectively, are both in a proportional relationship with ambient temperature. In this regard, however, the BNO oxide obtained by main firing at 550° C. has a temperature coefficient of about −360 ppm/° C. whereas the BNO oxide obtained by main firing at 650° C. has a temperature coefficient of about 150 ppm/° C.

These results obtained are very interesting in that the temperature coefficients, which indicate the ambient temperature-dependent change in dielectric constant, are of opposite signs between the BNO oxides obtained by main firing at 550° C. and 650° C., respectively. In other words, it has been found that the dielectric constant of the crystal phase of the pyrochlore-type crystal structure (first crystal phase) decreases almost linearly with increasing temperature of the BNO oxide whereas the dielectric constant of the crystal phase of the β-BiNbO$_4$ crystal structure (second crystal phase) increases almost linearly with increasing temperature of the BNO oxide.

Therefore, the results of FIGS. 8 and 9 suggest that controlling the contents of the first and second crystal phases by the heating step would make it possible to form a BNO oxide whose dielectric constant is extremely small in changes by changes in ambient temperature.

FIG. 10 is a graph showing the relationship between the main firing temperature and the temperature coefficient of the dielectric constant at a frequency of 1 kHz. For example, ambient temperature-dependent changes in dielectric constant are kept in the range of −60 ppm/° C. or more and 60 ppm/° C. or less in order to meet the requirements for improvements, particularly in the performance of electronic devices for information communication, which become severer year by year in the industrial field. FIG. 10 suggests that for this purpose, the content of the second crystal phase should be 1.43 or more and 4.67 or less, when the content of the first crystal phase is assumed to be 1, as calculated from the temperature coefficients of the BNO oxides obtained by main firing at 550° C. and 650° C., respectively. In addition, as to the main firing temperature in the heating step, it has also been found that ambient temperature-dependent changes in the dielectric constant can be kept in the range of −60 ppm/° C. or more and 60 ppm/° C. or less by setting the main firing temperature at about 593° C. or more and about 604° C. or less.

It is also suggested that in order to keep ambient temperature-dependent dielectric constant changes in the range of −10 ppm/° C. or more and 10 ppm/° C. or less, the content of the second crystal phase should be 2.19 or more and 2.64 or less, when the content of the first crystal phase is assumed to be 1, as calculated from the temperature coefficients of the BNO oxides obtained by main firing at 550° C. and 650° C., respectively. As to the main firing temperature in the heating step, it has also been found that ambient temperature-dependent changes in the dielectric constant can be kept in the range of −10 ppm/° C. or more and 10 ppm/° C. or less by setting the main firing temperature at about 596° C. or more and about 598° C. or less. It has been found that in any of the above value ranges, a BNO oxide whose dielectric constant is reduced in changes by changes in ambient temperature can be formed rather when the content of the crystal phase of the β-BiNbO$_4$ crystal structure (second crystal phase) with a relatively low dielectric constant is made higher than the content of the crystal phase of the pyrochlore-type crystal structure (first crystal phase) with a very high dielectric constant. This is a very interesting new finding.

Although not shown in FIGS. 6 to 10, the difference in the dielectric loss (tan δ) of the BNO oxide of this embodiment associated with changes in ambient temperature in the range of 25° C. or more and 120° C. or less is less than 0.01 for the first crystal phase and less than 0.01 for the second crystal phase, at a frequency of 1 kHz.

In this embodiment, the main firing time is set to 20 minutes in the heating step. However, it has been found that when the main firing time is increased, for example, to several hours to several tens of hours, even the BNO oxide obtained by main firing at 550° C. can have the crystal phase of the β-BiNbO$_4$ crystal structure (second crystal phase). Therefore, controlling the main firing temperature (first temperature) and/or the main firing time makes it possible to intentionally form a BNO oxide in which the crystal phase of the pyrochlore-type crystal structure (first crystal phase) exhibiting a very high dielectric constant is dominant or a BNO oxide in which the crystal phase of the β-BiNbO$_4$ crystal structure (second crystal phase) exhibiting a relatively low dielectric constant is dominant.

(2) Leakage Current

The precursor solution was prepared in such a way that the number of niobium (Nb) atoms was 1, when the number of bismuth (Bi) atoms was assumed to be 1, and then subjected to heating at 600° C. as main firing to form the oxide layer 30, which was subjected to the measurement of leakage current value under the application of 50 kV/cm. The resulting leakage current value showed that the capacitor had useful properties. The leakage current was measured with the voltage applied between the lower and upper electrode layers. The measurement was also performed using Model 4156C manufactured by Agilent Technologies, Inc.

As described above, in this embodiment, the contents of the first and second crystal phases in the BNO oxide and the oxide layer 30 are controlled by the heating step described above, so that the dielectric constant of the resulting BNO oxide can be extremely made small in changes by changes in ambient temperature. This shows that particularly preferred applications include a variety of solid state electronic devices (such as capacitors, semiconductor devices, small electromechanical systems, or a combined device including at least two of a high-frequency filter, a patch antenna, and an RCL).

Second Embodiment

This embodiment provides a multilayer capacitor 200 as an example of the solid state electronic device. At least one layer of the multilayer capacitor 200 is formed by screen printing. In this embodiment, the materials used to form the multilayer capacitor 200 include a BNO oxide, which is the same as the BNO oxide in First Embodiment. Therefore, repeated description of the same part as in First Embodiment can be omitted.

[Structure of Multilayer Capacitor 200]

FIG. 11 is s cross-sectional schematic view showing the structure of the multilayer capacitor 200 of this embodiment. As shown in FIG. 11, the multilayer capacitor 200 of this embodiment has a partial structure in which electrode layers (five in total) and dielectric layers (four in total) are alternately stacked. There is also a part in which the electrode and dielectric layers are not alternately stacked. In such a part, a lower-side electrode layer (e.g., the first electrode layer 220a) and an upper-side electrode layer (e.g., the fifth electrode layer 220e) are formed so as to be electrically connected to each other. The material and composition of each of the electrode layers 220a, 220b, 220c, 220d, and 220e and the material and composition of each of the oxide layers 230a, 230b, 230c, and 230d as dielectric layers will be disclosed in the description below of a method for manufacturing the multilayer capacitor 200 of this embodiment.

FIGS. 12 to 16 are cross-sectional schematic views each showing a process in a manufacturing method. Note that for the sake of convenience of illustration, FIGS. 12, 13, 14, 15, and 16 each extract and show a partial structure of the multilayer capacitor 200 shown in FIG. 11. Also note that the temperature values shown in the description each indicate the heater set temperature.

(1) Formation of First Electrode Layer 220a

In this embodiment, a precursor layer 221a for an electrode layer is first formed on a substrate 10 by a screen printing method as in First Embodiment using, as a starting material, a precursor solution containing a lanthanum (La)-containing precursor and a nickel (Ni)-containing precursor as solutes (such a solution will be referred to as an electrode layer-forming precursor solution; hereinafter the same applies to precursor solutions for the first to fifth electrode layers). Subsequently, preliminary firing is performed, in which the precursor layer is heated at 150° C. or more and 250° C. or less for about 5 minutes. The preliminary firing is performed in an oxygen-containing atmosphere.

The preliminary firing can sufficiently vaporize the solvent (typically the main solvent) from the precursor layer 221a for an electrode layer and form a preferred gel state (considered to be a state in which organic chains remain before thermal decomposition) in order to produce properties that will enable plastic deformation in the future. In order to achieve this aim more reliably, the preliminary firing temperature is preferably 80° C. or more and 250° C. or less. As a result, the precursor layer 221a for the first electrode layer is formed with a thickness of about 2 μm to about 3 μm. Screen printability (such as viscosity) may also be controlled as needed using a known material (such as ethyl cellulose) in the screen printing not only for the first electrode layer 220a but also for each layer described below.

Subsequently, main firing is performed, in which the precursor layer 221a for the first electrode layer is heated at 580° C. for about 15 minutes in an oxygen atmosphere, so that as shown in FIG. 4, a first electrode layer-forming oxide layer 220a (note that it possibly includes inevitable impurities; the same applies hereinafter; hereinafter also simply referred to as the "first electrode layer") including lanthanum (La) and nickel (Ni) is formed on the substrate 10. Electrode-forming oxide layers (including not only the first electrode-forming oxide layer but also other electrode-forming oxide layers) including lanthanum (La) and nickel (Ni) are also called LNO layers.

In this embodiment, the lanthanum (La)-containing precursor for the first electrode layer 220a is, for example, lanthanum acetate. Other examples of the lanthanum (La)-containing precursor that may be used include lanthanum nitrate, lanthanum chloride, or various lanthanum alkoxides (e.g., lanthanum isopropoxide, lanthanum butoxide, lanthanum ethoxide, and lanthanum methoxyethoxide). In this embodiment, the nickel (Ni)-containing precursor for the first electrode layer 220a is, for example, nickel acetate. Other examples of the nickel (Ni)-containing precursor that may be used include nickel nitrate, nickel chloride, or various nickel alkoxides (e.g., nickel isopropoxide, nickel butoxide, nickel ethoxide, and nickel methoxyethoxide).

In this embodiment, although the first electrode layer 220a used includes lanthanum (La) and nickel (Ni), the first electrode layer 220a may have any other composition. For example, a first electrode layer (note that it possibly includes inevitable impurities; the same applies hereinafter) consisting essentially of antimony (Sb) and tin (Sn) may also be used. In this case, examples of the antimony (Sb)-containing precursor that may be used include antimony acetate, antimony nitrate, antimony chloride, or various antimony alkoxides (e.g., antimony isopropoxide, antimony butoxide, antimony ethoxide, and antimony methoxyethoxide). Examples of the tin (Sn)-containing precursor that may be used include tin acetate, tin nitrate, tin chloride, or various tin alkoxides (e.g., tin isopropoxide, tin butoxide, tin ethoxide, and tin methoxyethoxide). An oxide (note that it possibly includes inevitable impurities; the same applies hereinafter) including indium (In) and tin (Sn) may also be used. In this case, examples of the indium (In)-containing precursor that may be used include indium acetate, indium nitrate, indium chloride, or various indium alkoxides (e.g., indium isopropoxide, indium butoxide, indium ethoxide, and indium methoxyethoxide). Examples of the tin (Sn)-containing precursor are the same as mentioned above.

(2) Formation of First Dielectric Layer (Oxide Layer) 230a

As shown in FIG. 5, a patterned precursor layer is first formed on the substrate 10 by a screen printing method using, as a starting material, a precursor solution containing a bismuth (Bi)-containing precursor and a niobium (Nb)-containing precursor as solutes. Subsequently, preliminary firing is performed, in which the precursor layer is heated at 250° C. for about 5 minutes. The preliminary firing is performed in an oxygen-containing atmosphere.

The preliminary firing can sufficiently vaporize the solvent (typically the main solvent) from the precursor layer and form a preferred gel state (considered to be a state in which organic chains remain before thermal decomposition) in order to produce properties that will enable plastic deformation in the future. In order to achieve this aim more reliably, the preliminary firing temperature is preferably 80° C. or more and 250° C. or less. In this embodiment, the formation of the precursor layer by the screen printing method and the preliminary firing are performed in order to form a sufficiently thick (e.g., about 2 μm to about 3 μm thick) oxide layer 230a as a dielectric layer.

Subsequently, a heating step for main firing is performed, in which the precursor layer for the oxide layer 230a is heated in an oxygen atmosphere at 600° C. for a certain period of time (e.g., about 20 minutes), so that as shown in FIG. 14, a patterned oxide layer (oxide layer 230a) including bismuth (Bi) and niobium (Nb) is formed on the substrate 10 and the first electrode layer 220a. In this process, the main firing under the above conditions makes it possible to control the content of a BNO oxide in which the crystal phase of the pyrochlore-type crystal structure (first crystal phase) exhibiting a very high dielectric constant is dominant and to control the content of a BNO oxide in which the crystal phase of the β-BiNbO$_4$ crystal structure (second crystal phase) exhibiting a relatively low dielectric constant is dominant. Therefore, ambient temperature-dependent changes in the dielectric constant of the oxide layer 230a can be kept in the range of −60 ppm/° C. or more and 60 ppm/° C. or less as in the example shown in FIG. 10 according to First Embodiment.

(3) Formation of Second and Subsequent Electrodes and Dielectric Layers

Subsequently, patterned electrode and dielectric layers are alternately stacked using the above-described process of forming, by screen printing, the electrode layer (first electrode layer 220a) and the oxide layer 230a as a dielectric layer.

Specifically, after the first oxide layer 230a is patterned, a patterned precursor layer for a second electrode layer is formed on the oxide layer 230a and the first electrode layer 220a by screen printing similarly to the precursor layer 221a for the first electrode layer. Subsequently, as shown in FIG. 15, a patterned second electrode layer 220b is formed.

Subsequently, as shown in FIG. 16, a patterned second dielectric layer 230b is formed by screen printing on the second electrode layer 220b and the oxide layer 230a as the first dielectric layer.

In this way, the patterned electrode and dielectric layers are alternately stacked by screen printing, so that the multilayer capacitor 200 shown in FIG. 11 is finally obtained.

It is especially worth noting that the electrode layers and the dielectric layers (oxide layers) are each made of a metal oxide in the multilayer capacitor 200 of this embodiment. Additionally, in this embodiment, the electrode layers and the dielectric layers (oxide layers) are each formed by heating a certain precursor solution in an oxygen-containing atmosphere, which makes it easy to perform large-area fabrication as compared to conventional methods and also makes it possible to significantly increase the industrial or mass productivity.

One skilled in the art will understand from the disclosure herein that the above-described steps of forming each electrode layer and each dielectric layer (oxide layer) may be further alternately repeated to stack the layers upward.

Third Embodiment

1. Overall Structure of Thin Film Capacitor of this Embodiment

In this embodiment, imprinting is performed in the process of forming all layers of a thin film capacitor as an example of the solid state electronic device. FIG. 17 shows the overall structure of a thin film capacitor 300 as an example of the solid state electronic device according to this embodiment. This embodiment is the same as First Embodiment, except that the lower electrode layer, the oxide layer, and the upper electrode layer are subjected to imprinting. Note that repeated description of the same part as in First Embodiment will be omitted.

As shown in FIG. 17, the thin film capacitor 300 of this embodiment is formed on a substrate 10 as in First Embodiment. The thin film capacitor 300 includes a lower electrode 320, an oxide layer 330 including a BNO oxide, and an upper electrode layer 340, which are arranged in order from the substrate 10 side.

2. Process of Manufacturing Thin Film Capacitor 300

Next, a method for manufacturing the thin film capacitor 300 will be described. FIGS. 18 to 27 are cross-sectional schematic views each showing a process in the method for manufacturing the thin film capacitor 300. In the manufacture of the thin film capacitor 300, an imprinted lower electrode layer 320 is first formed on the substrate 10. An imprinted oxide layer 330 is then formed on the lower electrode layer 320. Subsequently, an imprinted upper electrode layer 340 is formed on the oxide layer 330. Repeated description of the same part of the process of manufacturing the thin film capacitor 300 as in First Embodiment will also be omitted.

(1) Formation of Lower Electrode Layer

This embodiment provides an example where the lower electrode layer 320 of the thin film capacitor 300 is made of a conductive oxide layer including lanthanum (La) and nickel (Ni). The lower electrode layer 320 is formed by sequentially performing the steps of (a) forming a precursor layer and then subjecting the precursor layer to preliminary firing, (b) subjecting the preliminarily fired layer to imprinting, and (c) subjecting the imprinted layer to main firing. First, a precursor layer 320a for a lower electrode layer is formed on the substrate 10 by a known spin coating method using, as a starting material, a lower electrode layer-forming precursor solution containing a lanthanum (La)-containing precursor and a nickel (Ni)-containing precursor as solutes.

Subsequently, preliminary firing is performed, in which the precursor layer 320a for a lower electrode layer is heated in the temperature range of 80° C. or more and 250° C. or less for a certain period of time in an oxygen-containing atmosphere. The formation of the precursor layer 320a for a lower electrode layer by spin coating and the preliminary firing may also be repeated a plurality of times, so that the lower electrode layer 320 can be formed with a desired thickness.

(b) Imprinting

As shown in FIG. 18, the precursor layer 320a for a lower electrode layer is then patterned by imprinting at a pressure of 0.1 MPa or more and 20 MPa or less using a lower electrode layer-forming mold M1 while it is heated in the range of 80° C. or more and 300° C. or less. Examples of the heating method during the imprinting include a method of maintaining an atmosphere at a certain temperature in a chamber, an oven, or other means, a method of heating, with a heater, a lower part of a mount on which the substrate is mounted, and a method of performing imprinting using a mold heated in advance at 80° C. or more and 300° C. or less. In this case, in view of workability, the method of heating a lower part of a mount with a heater is more preferably used in combination with the method using a mold heated in advance at 80° C. or more and 300° C. or less.

In this case, the mold heating temperature is set at 80° C. or more and 300° C. or less for the following reason. If the heating temperature during the imprinting is less than 80° C., the ability to plastically deform the precursor layer 320a for a lower electrode layer will decrease due to the reduced temperature of the precursor layer 320a for a lower electrode layer, so that the ability to form an imprinted structure will decrease or the reliability or stability after the forming will decrease. If the heating temperature during the imprinting is more than 300° C., the decomposition (oxidative pyrolysis) of organic chains as a source of plastic deformability can proceed, so that the plastic deformation ability can decrease. From the above points of view, it is a more preferred mode to heat the precursor layer 320a for a lower electrode layer in the range of 100° C. or more and 250° C. or less during the imprinting.

The pressure during the imprinting should be in the range of 0.1 MPa or more and 20 MPa or less, so that the precursor layer 320a for a lower electrode layer can be deformed so as to follow the surface shape of the mold, which makes it possible to form a desired imprinted structure with high precision. The pressure applied during the imprinting should also be set in a low range, such as 0.1 MPa or more and 20 MPa or less (particularly, less than 1 MPa). This makes the mold less likely to be damaged during the imprinting and is also advantageous for large-area fabrication.

The entire surface of the precursor layer 320a for a lower electrode layer is then subjected to etching. As a result, as shown in FIG. 19, the precursor layer 320a for a lower electrode layer is completely removed from a region other than the region corresponding to a lower electrode layer (the step of subjecting the entire surface of the precursor layer 320a for a lower electrode layer to etching).

In addition, the imprinting process preferably includes previously performing a release treatment on the surface of each precursor layer, which is to be in contact with the imprinting surface, and/or previously performing a release treatment on the imprinting surface of the mold, and then imprinting each precursor layer. Such a treatment is performed. As a result, the friction force between each precursor layer and the mold can be reduced, so that each precursor layer can be subjected to imprinting with higher precision. Examples of a release agent that may be used in the release treatment include surfactants (such as fluoro-surfactants, silicone surfactants, and nonionic surfactants), and fluorine-containing diamond-like carbon materials.

(c) Main Firing

The precursor layer 320a for a lower electrode layer is then subjected to main firing in the air. During the main firing, the heating temperature is 550° C. or more and 650° C. or less. As a result, as shown in FIG. 20, a lower electrode layer 320 (note that it possibly includes inevitable impurities; the same applies hereinafter) consisting essentially of lanthanum (La) and nickel (Ni) is formed on the substrate 10.

(2) Formation of Oxide Layer as Dielectric Layer

An oxide layer 330 as a dielectric layer is then formed on the lower electrode layer 320. The oxide layer 330 is formed by sequentially performing the steps of (a) forming a precursor layer and then subjecting the precursor layer to preliminary firing, (b) subjecting the preliminarily fired layer to imprinting, and (c) subjecting the imprinted layer to main firing. FIGS. 21 to 24 are views showing the process of forming the oxide layer 330.

(a) Formation of BNO Oxide Precursor Layer and Preliminary Firing

As shown in FIG. 21, a precursor layer 330a is formed on the substrate 10 and the patterned lower electrode layer 320 using, as a starting material, a precursor solution containing a bismuth (Bi)-containing precursor and a niobium (Nb)-containing precursor as solutes, as in Second Embodiment. In this embodiment, preliminary firing is then performed by heating at 80° C. or more and 150° C. or less in an oxygen-containing atmosphere. In this regard, the inventors' study has revealed that in this embodiment, heating the precursor layer 330a in the range of 80° C. or more and 150° C. or less can increase the ability of the precursor layer 330a to be plastically deformed and can sufficiently remove the solvent (typically the main solvent).

(b) Imprinting

In this embodiment, as shown in FIG. 22, the precursor layer 330a having undergone only the preliminary firing is subjected to imprinting. Specifically, the precursor layer 330a is imprinted at a pressure of 0.1 MPa or more and 20 MPa or less using a dielectric layer-forming mold M2 for oxide layer patterning while it is heated at 80° C. or more and 150° C. or less.

Subsequently, the entire surface of the precursor layer 330a is subjected to etching. As a result, as shown in FIG. 23, the precursor layer 330a is completely removed from a region other than the region corresponding to an oxide layer 330 (the step of subjecting the entire surface of the precursor layer 330a to etching). In this embodiment, the step of etching the precursor layer 330a is preformed using a wet etching technique without any vacuum process. However, etching by so-called a dry etching technique using plasma shall not be precluded.

(c) Main Firing

Subsequently, the precursor layer 330a is subjected to main firing as in Second Embodiment. As a result, as shown in FIG. 24, an oxide layer 330 as a dielectric layer (note that it possibly includes inevitable impurities; the same applies hereinafter) is formed on the lower electrode layer 320. A heating step for the main firing is performed, in which the precursor layer 330a is heated in an oxygen atmosphere at 600° C. for a certain period of time (e.g., about 20 minutes).

In this process, the main firing under the above conditions makes it possible to control the content of a BNO oxide in which the crystal phase of the pyrochlore-type crystal structure (first crystal phase) exhibiting a very high dielectric constant is dominant and to control the content of a BNO oxide in which the crystal phase of the β-BiNbO$_4$ crystal structure (second crystal phase) exhibiting a relatively low dielectric constant is dominant. As a result, ambient temperature-dependent changes in the dielectric constant of the oxide layer 230a can be kept in the range of −60 ppm/° C. or more and 60 ppm/° C. or less, more preferably in the range of −10 ppm/° C. or more and 10 ppm/° C. or less, as in the example shown in FIG. 10 according to First Embodiment.

Alternatively, the step of subjecting the entire surface of the precursor layer 330a to etching may be performed after the main firing. However, in a more preferred mode, as described above, the step of entirely subjecting the precursor layer to etching should be performed between the imprinting step and the main firing step. This is because the unnecessary region of each precursor layer can be more easily removed by etching before the main firing than after the main firing.

(3) Formation of Upper Electrode Layer

Subsequently, like the lower electrode layer 320, a precursor layer 340a for an upper electrode layer is formed on the oxide layer 330 by a known spin coating method using, as a starting material, a precursor solution containing a lanthanum (La)-containing precursor and a nickel (Ni)-containing precursor as solutes. Subsequently, preliminary firing is performed, in which the precursor layer 340a for an upper electrode layer is heated in the temperature range of 80° C. or more and 250° C. or less in an oxygen-containing atmosphere.

Subsequently, as shown in FIG. 25, the preliminarily fired precursor layer 340a for an upper electrode layer is patterned by imprinting at a pressure of 0.1 MPa or more and 20 MPa or less using an upper electrode layer-forming mold M3 while the precursor layer 340a is heated at 80° C. or more and 300° C. or less. Subsequently, as shown in FIG. 26, the entire surface of the precursor layer 340a for an upper electrode layer is subjected to etching so that the precursor layer 340a for an upper electrode layer is completely removed from a resin other than the region corresponding to an upper electrode layer 340.

Subsequently, as shown in FIG. 27, main firing is performed, in which the precursor layer 340a for an upper electrode layer is heated at 520° C. to 600° C. for a certain period of time in an oxygen atmosphere, so that an upper electrode layer 340 (possibly including inevitable impurities; the same applies hereinafter) consisting essentially of lanthanum (La) and nickel (Ni) is formed on the oxide layer 330.

The thin film capacitor 300 of this embodiment includes the lower electrode 320, the oxide layer 330 as an insulating layer, and the upper electrode layer 340, which are provided on the substrate 10 and arranged in order from the substrate 10 side. As described above, each layer has an imprinted structure formed by imprinting. This can eliminate the need for a process that takes a relatively long time and/or requires an expensive facility, such as a vacuum process, a photolithographic process, or an ultraviolet exposure process. This enables simple patterning of all the electrode layers and the oxide layer. Therefore, the thin film capacitor 300 of this embodiment has excellent industrial or mass productivity.

In a modification of this embodiment, a precursor layer 320a for the lower electrode layer 320, a precursor layer 330a for the oxide layer 330, and a precursor layer 340a for the upper electrode layer 340 may be stacked on the substrate 10, and then the stack may be subjected to imprinting. This process may also be used as another mode. Subsequently, the main firing may be performed. When this process is used, the number of times of imprinting can be reduced although in this mode, an imprinted structure cannot be formed for each individual layer in contrast to the above process for the thin film capacitor 300.

Fourth Embodiment

The results obtained by the inventors' study and analysis show that the feature found in each embodiment described above, namely, the feature that the dielectric constant of the first crystal phase decreases with increasing temperature of the BNO oxide whereas the dielectric constant of the second crystal phase increases with increasing temperature of the BNO oxide is widely applicable.

FIG. 28 is a graph showing the relationship between the temperature coefficient (ppm/° C.) of the dielectric constant at a frequency of 1 kHz obtained at a main firing temperature of 600° C. in First Embodiment and the concentration (atm %) of niobium (Nb) in the precursor solution in First Embodiment. Note that in the graph, the broken line is drawn for convenience.

FIG. 28 shows that the temperature coefficient shifts to the negative side as the concentration of niobium (Nb) in the precursor solution increases. It has also been found that at least in the range of from 55 atm % to 60 atm %, the temperature coefficient shows almost no change, in other words, is kept at a stable value, even when the concentration of niobium (Nb) in the precursor solution is increased.

The results in FIG. 28 show the following two interesting points.

(1) When the main firing temperature is 600° C., the sign (plus or minus) of the temperature coefficient of the oxide layer can be reversed by changing the niobium (Nb) concentration.

(2) When the main firing temperature is 600° C., the absolute value of the temperature coefficient of the oxide layer can be changed by changing the niobium (Nb) concentration.

However, even if the concentration of niobium (Nb) in the precursor solution is increased, an oxide dielectric or an oxide layer whose dielectric constant is less affected by changes in ambient temperature can be obtained by controlling the content of the first crystal phase whose dielectric constant decreases with increasing temperature of the oxide layer according to the embodiment in the temperature range of 25° C. or more and 120° C. or less and by controlling the content of the second crystal phase whose dielectric constant increases with increasing temperature of the oxide layer in the above temperature range.

In addition, even if the concentration of niobium (Nb) in the precursor solution is increased, for example, ambient temperature-dependent changes in the dielectric constant can be kept in the range of −60 ppm/° C. or more and 60 ppm/° C. or less by setting the value range of the content of the second crystal phase to the same value range as in First Embodiment when the content of the first crystal phase is assumed to be 1. However, as to the heating temperature in the heating step for the main firing, the temperature range for keeping ambient temperature-dependent changes in dielectric constant in the range of −60 ppm/° C. or more and 60 ppm/° C. or less will differ from the temperature range in First Embodiment, if the concentration of niobium (Nb) in the precursor solution is increased.

In particular, these features can be effectively utilized, for example, when the temperature of heating for a certain purpose (for main firing) is limited to a certain range due to constraints on certain device manufacturing equipment or other situations. It is especially worth noting that even when the heating temperature range is limited in a certain heat treatment, controlling the concentration of niobium (Nb) in the precursor solution makes it possible to form an oxide dielectric or an oxide layer whose dielectric constant is not or less affected by changes in ambient temperature in that temperature range.

Other Embodiments

In each embodiment described above, no post-annealing treatment is performed. In a modification of each embodiment described above, a post-annealing treatment may be performed, which is a preferred mode. For example, the post-annealing treatment may be performed after the imprinting and the patterning are completed.

An example of the post-annealing may be as follows. After the oxide layer 30 is formed by the step of main firing at a first temperature (600° C.) according to First Embodiment, the oxide layer 30 is further heated in an oxygen-containing atmosphere at a second temperature equal to or less than the first temperature (the second temperature is typically 350° C. or more and less than 600° C.) for about 20 minutes. This is effective in further increasing the adhesion between the oxide layer 30 and the underlying layer (namely, the lower electrode layer 20) and/or the upper electrode layer 40 with substantially no fluctuations in the dielectric constant of the thin film capacitor 100 of First Embodiment.

In the post-annealing treatment, the second temperature is preferably equal to or less than the first temperature. This is because if the second temperature is higher than the first temperature, the second temperature will be more likely to affect the physical properties of the oxide layer 230a. Therefore, the second temperature is preferably selected so as not to affect the physical properties of the oxide layer 230a. On the other hand, the lower limit of the second temperature in the post-annealing treatment is determined in order to further increase the adhesion to the underlying layer (namely, the lower electrode layer 20) and/or the upper electrode layer 40 as mentioned above.

The oxide layer according to each embodiment described above is suitable for various solid state electronic devices for controlling large currents at low driving voltages. The oxide layer according to each embodiment described above is also suitable for use in many other solid state electronic devices besides the thin film capacitors described above. For example, the oxide layer according to each embodiment described above is suitable for use in capacitors such as multilayer thin film capacitors and variable capacitance thin film capacitors; semiconductor devices such as metal oxide semiconductor field-effect transistors (MOSFETs) and non-volatile memories; devices for small electromechanical systems typified by nanoelectromechanical systems (NEMS) or microelectromechanical systems (MEMS) such as micro total analysis systems (TASs), micro chemical chips, and DNA chips; or other devices such as a combined device including at least two of a high frequency filter, a patch antenna, or an RCL.

In the above embodiment where imprinting is performed, the pressure during the imprinting is set in the range of "0.1 MPa or more and 20 MPa or less" for the reasons below. If the pressure is less than 1 MPa, the pressure may be too low to successfully imprint each precursor layer. On the other hand, a pressure of 20 MPa is high enough to sufficiently imprint the precursor layer, and there is no need to apply any pressure higher than 20 MPa. From the above points of view, the imprinting is more preferably performed at a pressure in the range of 0.1 MPa or more and 10 MPa or less in the imprinting step.

As described above, each of the above embodiments has been disclosed not for limiting the present invention but for describing these embodiments. Furthermore, modification examples made within the scope of the present invention, inclusive of other combinations of the embodiments, will be also included in the scope of claims.

The invention claimed is:

1. An oxide dielectric being an oxide (possibly including inevitable impurities) consisting essentially of bismuth (Bi), niobium (Nb), and oxygen, the oxide dielectric comprising:
   a first crystal phase of a pyrochlore-type crystal structure; and
   a second crystal phase of a $\beta$-$BiNbO_4$-type crystal structure,
   the oxide dielectric having a controlled content of the first crystal phase and a controlled content of the second crystal phase,
   wherein the first crystal phase has a dielectric constant that decreases with increasing temperature of the oxide in a temperature range of 25° C. or more and 120° C. or less, and
   the second crystal phase has a dielectric constant that increases with increasing temperature of the oxide in the temperature range.

2. An oxide dielectric being an oxide (possibly including inevitable impurities) consisting essentially of bismuth (Bi), niobium (Nb), and oxygen, the oxide dielectric comprising:
   a first crystal phase of a pyrochlore-type crystal structure; and
   a second crystal phase of a $\beta$-$BiNbO_4$-type crystal structure,
   wherein a content of the second crystal phase is 1.43 or more and 4.67 or less when a content of the first crystal phase is assumed to be 1.

3. The oxide dielectric according to claim 1, further comprising:
   a third crystal phase of a $Bi_3NbO_7$-type crystal structure and an amorphous phase,
   wherein a sum of the contents of the first and second crystal phases is more than 40% of a whole of the oxide.

4. The oxide dielectric according to claim 1, which has a dielectric constant of 54 or more and 140 or less.

5. A solid state electronic device comprising the oxide dielectric according to claim 1.

6. The solid state electronic device according to claim 5, which is one selected from the group consisting of a capacitor, a semiconductor device, and a small electromechanical system.

7. A method for manufacturing an oxide dielectric, the method comprising:
   a heating step of heating, in an oxygen-containing atmosphere, a precursor derived from a precursor solution, as a starting material, comprising a bismuth (Bi)-containing precursor and a niobium (Nb)-containing precursor as solutes, to form an oxide (possibly including inevitable impurities) consisting essentially of bismuth (Bi), niobium (Nb), and oxygen, and to control contents of a first crystal phase of a pyrochlore-type crystal structure and a second crystal phase of a $\beta$-$BiNbO_4$-type crystal structure, the oxide comprising:
   the first crystal phase of the pyrochlore-type crystal structure having a dielectric constant that decreases with increasing temperature of the oxide in a temperature range of 25° C. or more and 120° C. or less; and
   the second crystal phase of the $\beta$-$BiNbO_4$-type crystal structure having a dielectric constant that increases with increasing temperature of the oxide in a temperature range of 25° C. or more and 120° C. or less.

8. A method for manufacturing an oxide dielectric, the method comprising:
   a heating step performed in such a manner that a content of a second crystal phase of a $\beta$-$BiNbO_4$-type crystal structure is controlled to be 1.43 or more and 4.67 or less when a content of a first crystal phase of a pyrochlore-type crystal structure is assumed to be 1, by heating, in an oxygen-containing atmosphere, a precursor derived from a precursor solution, as a starting material, comprising a bismuth(Bi)-containing precursor and a niobium (Nb)-containing precursor as solutes, to form an oxide (possibly including inevitable impurities) consisting essentially of bismuth (Bi), niobium (Nb), and oxygen, the oxide comprising:

the first crystal phase of the pyrochlore-type crystal structure; and the second crystal phase of the β-BiNbO$_4$-type crystal structure.

9. The method according to claim 7, wherein the oxide formed by the heating step further comprises a third crystal phase of a Bi$_3$NbO$_7$-type crystal structure and an amorphous phase, and a sum of the contents of the first and second crystal phases is controlled to be more than 40% of a whole of the oxide.

10. The method according to claim 7, further comprising a step of imprinting a layer of the precursor while heating the layer of the precursor in an oxygen-containing atmosphere at 80° C. or more and 150° C. or less so that an imprinted structure of the precursor is formed, before forming a layer of the oxide dielectric.

11. A method for manufacturing a solid state electronic device, the method comprising manufacturing a solid state electronic device comprising the oxide dielectric according to claim 7.

12. The oxide dielectric according to claim 2, further comprising: a third crystal phase of a Bi$_3$NbO$_7$-type crystal structure and an amorphous phase, wherein a sum of the contents of the first and second crystal phases is more than 40% of a whole of the oxide.

13. The oxide dielectric according to claim 2, which has a dielectric constant of 54 or more and 140 or less.

14. A solid state electronic device comprising the oxide dielectric according to claim 2.

15. The solid state electronic device according to claim 14, which is one selected from the group consisting of a capacitor, a semiconductor device, and a small electromechanical system.

16. The method according to claim 8, wherein the oxide formed by the heating step further comprises a third crystal phase of a Bi$_3$NbO$_7$-type crystal structure and an amorphous phase, and a sum of the contents of the first and second crystal phases is controlled to be more than 40% of a whole of the oxide.

17. The method according to claim 8, further comprising a step of imprinting a layer of the precursor while heating the layer of the precursor in an oxygen-containing atmosphere at 80° C. or more and 150° C. or less so that an imprinted structure of the precursor is formed, before forming a layer of the oxide dielectric.

18. A method for manufacturing a solid state electronic device, the method comprising manufacturing a solid state electronic device comprising the oxide dielectric according to claim 8.

* * * * *